(12) United States Patent
Yamamoto

(10) Patent No.: US 6,197,923 B1
(45) Date of Patent: Mar. 6, 2001

(54) POLYMERS, METHOD OF PRODUCING THE SAME AND USE OF THE SAME

(75) Inventor: Takakazu Yamamoto, Yokohama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 09/051,754

(22) PCT Filed: Oct. 24, 1996

(86) PCT No.: PCT/JP96/03096

§ 371 Date: Apr. 20, 1998

§ 102(e) Date: Apr. 20, 1998

(87) PCT Pub. No.: WO97/15607

PCT Pub. Date: May 1, 1997

(30) Foreign Application Priority Data

Oct. 27, 1995 (JP) .................................................... 7-303688

(51) Int. Cl.[7] .......................... C08G 43/06; C08F 126/06; C08F 226/06; C08F 26/06
(52) U.S. Cl. .......................... 528/424; 528/423; 528/422; 526/259; 526/265
(58) Field of Search .................................... 528/424, 423, 528/422; 526/259, 265

(56) References Cited

U.S. PATENT DOCUMENTS

| | | | |
|---|---|---|---|
| 5,244,992 | * 9/1993 | Yamamoto et al. | 526/471 |
| 5,367,037 | * 11/1994 | Yamamoto et al. | 526/259 |
| 5,436,316 | * 7/1995 | Yamamoto et al. | 528/422 |

FOREIGN PATENT DOCUMENTS

| | | |
|---|---|---|
| 1-210420 | 8/1989 | (JP) . |
| 5-70565 | 3/1993 | (JP) . |
| 6-56972 | 3/1994 | (JP) . |

OTHER PUBLICATIONS

Chem Abstract 124: 147384 "N–oxidation of pio conjugated poly (heterocycles)s containing nitrogen and electrically conductive properties of the N–oxidized products" "Yamamoto et al".*

Chem Abstract: 126: 172050 "Heat resistant electrically conductive polymers showing distinct color change by chemicl and electrochemical oxidation reduction and good solubility in organic solvents and manufacture thereof " Yamamoto Ryuichi.*

Yamamoto, Takakazu. "Electrically Conducting Polymers," *Kobunshi*, 38(12), 1989, Tokyo Inst. Technol., Tokyo, Japan, pp. 1080–1083.

Yoshino, Katsumi. "Electric and Optical Propoerties of Conducting Polymers and their Applications as Functional Elements and Devices," *Oyo Butsuri*, 56(11), 1987, Fac. Eng., Osaka University, Suita, Japan, pp. 1433–1446.

Yamamoto, Takakazu. "Polymer Batteries in Development. Search for Lighter Storage Batteries," *Denki Kagaku Oyobi Kogyo Butsuri Kagaku*, 54(4), 1986, Res. Lab. Resourc. Util, Tokyo Inst. Technol., Yokohama, Japan, pp. 306–311.

* cited by examiner

*Primary Examiner*—Duc Truong
(74) *Attorney, Agent, or Firm*—Oliff & Berridge, PLC

(57) ABSTRACT

N-Oxides of nitrogenous heterocycle or nitrogenous fused heterocycle polymers of general formula (1) or (7) (wherein any two of a, b, c, d, e, f, g and h are carbon atoms participating in the bonding between repeating units; at least one of them is N→O; the rest are each CH, N or N→O; and the degree of polymerization "n" is at least 5). These polymers have excellent heat resistance, are soluble in aqueous or organic solvents and controllable in the degree of depolarization and electrochemical redox potential, exhibit clear color changes by chemical or electrochemical oxidation or reduction, and are conductive per se . They can be used as moldings such as fibers and films; electrochromic elements; active materials and electrodes of cells; semiconductors including n-type semiconductors; and so on.

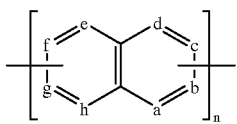
(7)
30 Claims, 3 Drawing Sheets
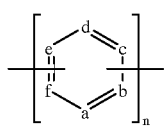
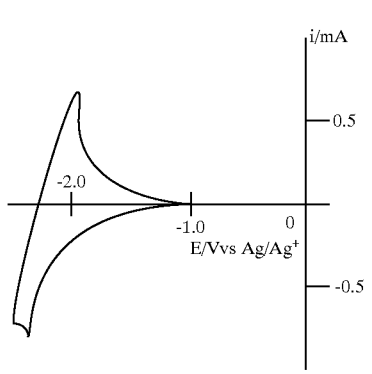
(1)

POLYMERS, METHOD OF PRODUCING THE SAME AND USE OF THE SAME

TECHNICAL FIELD

The present invention relates to N-oxidized poly (nitrogen-containing heterocyclic ring) and N-oxidized poly (nitrogen-containing condensed heterocyclic ring) which have excellent heat resistance, which are soluble in aqueous solvents or organic solvents, active in electrochemical oxidation and reduction whose potential can be controlled, color of which clearly changes by chemical or electrochemical oxidation-reduction, and which show conductivity by themselves, a method of producing the same, and use of the same.

BACKGROUND ART

Poly(arylene) having a structure that aromatic rings are serially bound, particularly poly(arylene) having serially π conjugated system along the main chain (for example, poly(p-phenylene), poly(2,5-thienylene), and poly(1,4-naphthalenediyl)) generally possess excellent heat resistance. Further, it is known that addition products of these poly(arylene) to electron acceptors (e.g., $AsF_5$, etc.) or electron donors (e.g., lithium, sodium, etc.) have conductivity and have property to change their color reversibly (electrochromic) by electrochemical oxidation-reduction so as to be available as materials for displays (for example, High polymers, Japan 38, 1080 (1989)). Japanese Patent Application Laid-Open No.Hei 1-210420 discloses conductive substances produced by reducing polymers having serial π conjugated system along the main chain and groups composed of 6-membered heterocyclic ring units, for example, a 2,5-pyridinediyl group as a repeating constitutive unit. Japanese Patent Application Laid-Open No.Hei 5-70565 discloses poly(quinolinediyl) and poly (isoquinolinediyl), which are composed of condensed heterocyclic ring units and Japanese Patent Application No. Hei 6-56972 discloses quaternary poly(quinolinediyl) and poly (isoquinolinediyl).

However, most of the poly(arylene)s conventionally proposed show low solubility in water or organic solvents and are not melted, which restricts their application and is an obstacle to elicit their characteristic functions. With respect to the above-described poly(arylene)s, it has been desired to modify the molecular structure so as to develop such substances as having properties different from the conventionally known poly(arylene)s. For example, if it is possible to obtain poly(arylene) that has oxidation-reduction potential or changes its color (electrochromic phenomenon), different from the known poly(arylene)s, it would be used as an electrode to provide an electrochromic display which has characteristics different from the conventionally used electrochromic indicative material (for example, "OYO BUTURI", Vol.56, 1433 (1987)) or it would be used as an active material or an electrode to provide a polymer battery that has characteristics different from the known polymer battery (for example, "Denki Kagaku (Journal of the Electrochemical Society of Japan)" 54, 306 (1986)). In order to confer conductivity on poly(arylene)s, it is necessary to effect oxidation (p-doping) or reduction (n-doping) of poly (arylene)s that are usually in a neutral state (cf. the above-described portions of OYO BUTURI and Denki Kagaku (Journal of the Electrochemical Society of Japan)). This oxidation-reduction is disadvantageous in that a corrosive oxidizing agent such as iodine is used, that the process is complicated, and that dopants such as $I^-$, $ClO_4^-$, or $NR_4^+$ may possibly render poly(arylene), which becomes conductive, chemically and physically unstable. Accordingly, it has been desired to develop materials made of poly(arylene)s or its derivatives having no such a dopant and showing conductivity by themselves.

DESCRIPTION OF THE INVENTION

Under these circumstances, the present invention was completed as a result of intensive investigation to screen poly(arylene)s having a novel molecular structure.

An object of the present invention is to provide poly (arylene), particularly N-oxidated (nitrogen-containing heterocyclic ring) polymer and N-oxidated (nitrogen-containing condensed heterocyclic ring) polymer, which have excellent heat resistance, which are soluble in aqueous solvents or organic solvents, depolarization and electrochemical oxidation-reduction potential of which can be controlled, color of which clearly changes by chemical or electrochemical oxidation-reduction, and which show conductivity by themselves.

Another object of the present invention is to apply such a novel N-oxidated poly(nitrogen-containing heterocyclic ring) and N-oxidated poly(nitrogen-containing condensed heterocyclic ring) to moldings such as fiber or film, an electrochromic element, an active material or an electrode for a battery, semiconductor, n-type semiconductor, and the like.

The N-oxidated poly(nitrogen-containing heterocyclic ring) is a polymer containing a polymer chain represented by the formula (1):

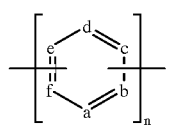

(1)

wherein two of any of a, b, c, d, e, and f represent carbon atoms that are involved in binding between repeating units, at least one of them represents an N→O group, the remainings independently represent a CH group or a nitrogen atom, the maximum total number of the N→O groups resented by a, b, c, d, e, and f is 2, the maximum total number of the nitrogen atoms is 3, and the degree of polymerization n is at least 5, or a polymer containing a polymer chain represented by the formula (2):

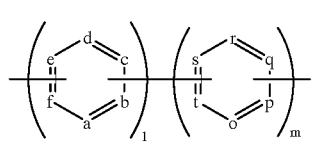

(2)

wherein two of any of a, b, c, d, e, and f represent carbon atoms that are involved in binding between repeating units, at least one of them represents an N→O group, the remainings independently represent a CH group or a nitrogen atom, the maximum total number of the N→O groups represented by a, b, c, d, e, and f is 2, the maximum total number of the nitrogen atoms is 3, two of any of o, p, q, r, s, and t represent carbon atoms that are involved in binding between repeating units, the remainings independently represents a CH group or a nitrogen atom, the maximum total number of the nitrogen atoms represented by o, p, q, r, s, and t is 3, and the degree of polymerization l+m is at least 5.

The polymer of the above formula (1) is a polymer mainly containing a repeating unit of a nitrogen-containing heterocyclic ring whose nitrogen atom is oxidated, while the polymer of the above formula (2) is a copolymer containing a repeating unit of a nitrogen-containing heterocyclic ring whose nitrogen atom is oxidated and a repeating unit of a nitrogen-containing heterocyclic ring whose nitrogen atom is not oxidated. These polymers can further have another repeating unit, for example a repeating unit conventionally known as the one forming π conjugated macromolecule such as a (thiophen-2,5-diyl) unit.

In the copolymer of the above formula (2), the repeating unit of a nitrogen-containing heterocyclic ring whose nitrogen atom is oxidated and the repeating unit of a nitrogen-containing heterocyclic ring whose nitrogen atom is non-oxidated are copolymerized at random.

The subgroup of the N-oxidated poly(nitrogen-containing heterocyclic ring) represented by the above formula (1) include N-oxidated poly(pyridinediyl), poly(pyrazinediyl), poly(pyrimidi nediyl), and poly(pyridazinediyl) represented by the following formula (1a), (1b), (1c), and (1d), respectively:

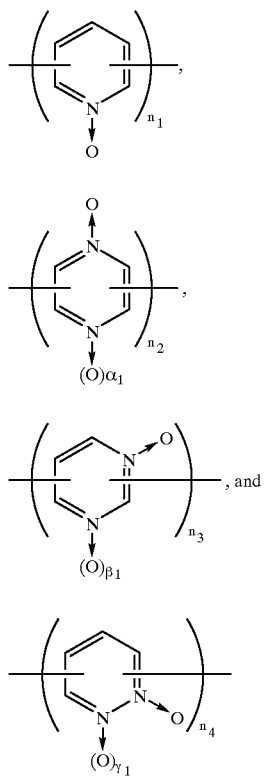

wherein the degree of polymerization $n_1$, $n_2$, $n_3$, and $n_4$ represent at least 5 and ($\alpha_1$, $\beta_1$, and $\gamma_1$ represent 0 or 1.

The subgroup of the N-oxidated poly(nitrogen-containing heterocyclic ring) represented by the above formula (2) include N-oxidated poly(pyridinediyl), poly(pyrazinediyl), poly(pyrimidinediyl), and poly(pyridazinediyl) copolymers represented by the following formula (2a), (2b), (2c), and (2d), respectively:

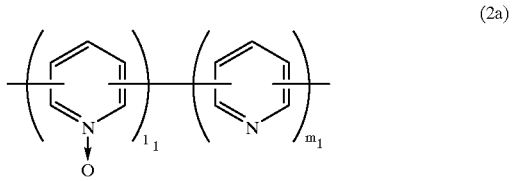

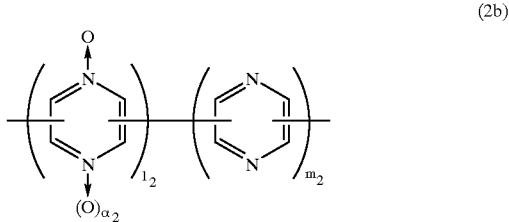

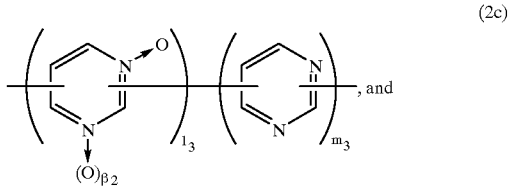

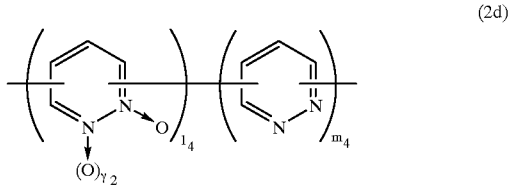

wherein the degree of polymerization $l_1+m_1$, $l_2+m_2$, $l_3+m_3$, and $l_4+m_4$ represent at least 5 and $\alpha_2$, $\beta_2$ and $\gamma_2$ represent 0 or 1.

The N-oxidated poly(nitrogen-containing condensed heterocyclic ring) is a polymer containing a polymer chain represented by the formula (7):

wherein two of any of a, b, c, d, e, f, g and h represent carbon atoms that are involved in binding between repeating units, at least one of them represents an N→O group, the remainings independently represent a CH group or a nitrogen atom, the maximum total number of the N→O groups represented by a, b, c, and d is 2, the maximum total number of the nitrogen atoms is 3, the maximum total number of the N→O groups represented by e, f, g, and h is 2, the maximum total number of the nitrogen atoms is 3, and the degree of polymerization n is at least 5, or a polymer containing a polymer chain represented by the formula (8):

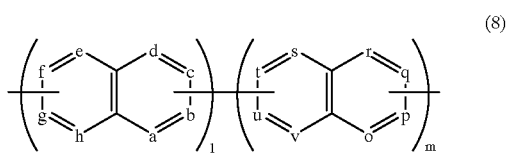

wherein two of any of a, b, c, d, e, f, g, and h represent carbon atoms that are involved in binding between repeating units, at least one of them represents an N→O group, the remainings independently represent a CH group or a nitrogen atom, the maximum total number of the N→O groups represented by a, b, c, and d is 2, the maximum total number of the nitrogen atoms is 3, the maximum total number of the N→O groups represented by e, f, g, and h is 2, the maximum total number of the nitrogen atoms is 3, two of any of o, p, q, r, s, t, u, and v represent carbon atoms that are involved in binding between repeating units, the remainings independently represent a CH group or a nitrogen atom, the maximum total number of the nitrogen atoms represented by o, p, q, and r is 3, the maximum total number of the nitrogen atoms represented by s, t, u, and v is 3, and the degree of polymerization l+m is at least 5.

The subgroup of the N-oxidated poly(nitrogen-containing condensed heterocyclic ring) represented by the above formula (7) include N-oxidated poly(quinolinediyl), poly(quinoxalinediyl), and poly(naphthyridinediyl) represented by the following formula (7a), (7b-1), (7b-2), (7c-1), and (7c-2), respectively:

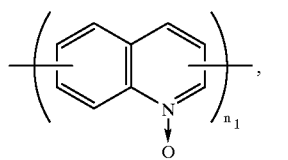
(7a)

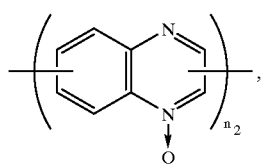
(7b-1)

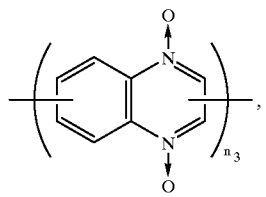
(7b-2)

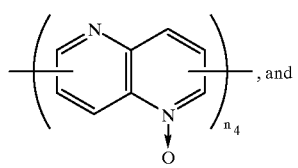
(7c-1)

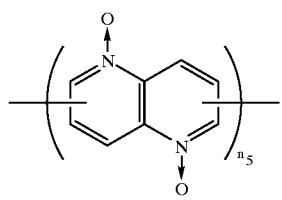
(7c-2)

wherein the degree of polymerization $n_1$, $n_2$, $n_3$, $n_4$, and $n_5$ represent at least 5.

The subgroup of the N-oxidated poly(nitrogen-containing condensed heterocyclic ring) represented by the above formula (8) include N-oxidated poly(quinolinediyl), poly(quinoxalinediyl), and poly(naphthyridinediyl) copolymers represented by the following formula (8a), (8b-1), (8b-2), (8c-1), and (8c-2), respectively:

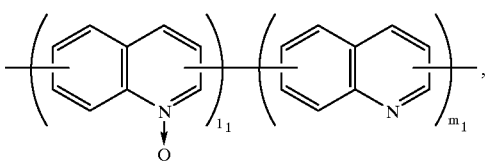
(8a)

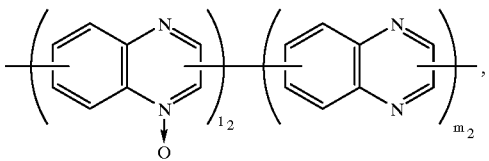
(8b-1)

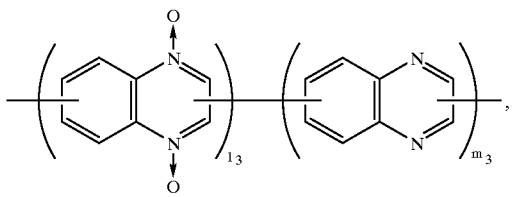
(8b-2)

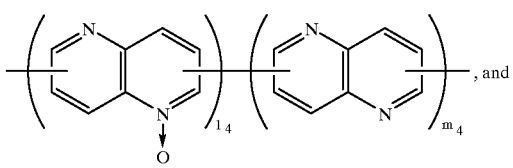
(8c-1), and

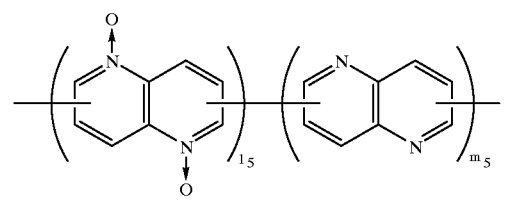
(8c-2)

wherein the degree of polymerization $l_1+m_1$, $l_2+m_2$, $l_3+m_3$, $l_4+m_4$, and $l_5+m_5$ represent at least 5.

The polymer of the above formula (7) is a polymer mainly containing a repeating unit of a nitrogen-containing condensed heterocyclic ring whose nitrogen atom is oxidated and the polymer of the above formula (8) is a copolymer containing a repeating unit of a nitrogen-containing heterocyclic ring whose nitrogen atom is oxidated and a repeating unit of a nitrogen-containing heterocyclic ring whose nitrogen atom is not oxidated. These polymers can further have another repeating unit, for example a repeating unit conventionally known as the one forming π conjugated macromolecule such as a (thiophen-2,5-diyl) unit.

In the copolymer of the above formula (8), the repeating unit of a nitrogen-containing condensed heterocyclic ring whose nitrogen atom is oxidated and the repeating unit of a nitrogen-containing condensed heterocyclic ring whose nitrogen atom is not oxidated are copolymerized at random.

The degree of polymerization of the polymer group of the above formulae (1), (2), (7), and (8) ranges from 5 to 1,000, preferably 5 to 500, particularly preferably 10 to 250. If the degree of polymerization is less than 5, the polymer cannot sufficiently exhibit its function as a polymer.

The method of producing the polymer of the present invention will be described below.

Production Method (I)

N-oxidated poly(nitrogen-containing heterocyclic ring) can be produced by reacting poly(nitrogen-containing heterocyclic ring) containing as a constitutive unit divalent groups represented by the formula (3):

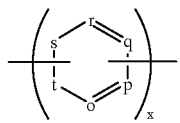
(3)

wherein o, p, q. r, s, and t have the same meaning as described above, and the degree of polymerization x is at least 5, particularly poly(pyridinediyl), poly(pyrazinediyl), poly(pyrimidinediyl), or poly(pyridazinediyl), which contains as a constitutive unit divalent groups represented by the formula (3a), (3b), (3c), or (3d):

(3a)

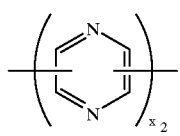
(3b)

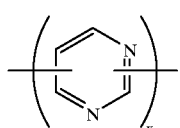
(3c)

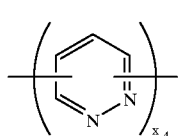
(3d)

wherein the degree of polymerization $x_1$, $x_2$, $x_3$, and $x_4$ are each at least 5, with an appropriate peroxide, such as peracetic acid (hydrogen peroxide and glacial acetic acid), persulfuric acid, or m-chloroperbenzoic acid, to N-oxidate the nitrogen atoms in the ring.

The peroxide to be used in this reaction is not limited to the above-described examples. Either the compounds of the formula (1) or (2), namely the formula (1a) or (2a), the formula (1b) or (2b), the formula (1c) or (2c), and the formula (1d) or (2d), can be produced selectively by altering the type and the amount of peroxide to be used, and the reaction conditions.

Similarly, N-oxidated poly(nitrogen-containing condensed heterocyclic ring) can be produced by reacting poly(nitrogen-containing condensed heterocyclic ring) containing as a constitutive unit divalent groups represented by the formula (9):

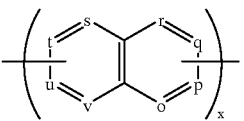
(9)

wherein o, p, q. r, s, t, u, and v have the same meaning as described above, and the degree of polymerization x is at least 5, particularly poly(quinolinediyl), poly(quinoxalinediyl), or poly(naphthyridinediyl), which contains as a constitutive unit divalent groups represented by the formula (9a), (9b), or (9c):

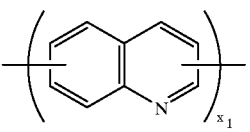
(9a)

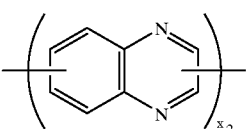
(9b)

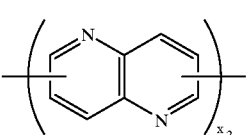
(9c)

wherein the degree of polymerization $x_1$, $x_2$, and $x_3$ are each at least 5, with an appropriate peroxide, such as peracetic acid (hydrogen peroxide and glacial acetic acid), persulfuric acid, or m-chloroperbenzoic acid, to N-oxidate the nitrogen atoms in the ring.

The peroxide to be used in this reaction is not limited to the above-described examples. Either the compounds of the formula (7) or (8), namely the formula (7a) or (8a), the formula (7b-1) or (8b-1), the formula (7b-2) (8b-2), the formula (7c-1) or (8c-1), and the formula (7c-2) or (8c-2), can be produced selectively by altering the type and the amount of peroxide to be used, and the reaction conditions.

Production Method II

Another method of producing N-oxidated poly (nitrogen-containing heterocyclic ring) of the present invention includes a method of reacting a dihalide derivative represented by the formula (4):

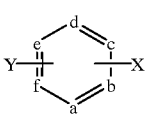
(4)

wherein X and Y represent a halogen atom, two of any of a, b, c, d, e, and f represent carbon atoms that bind to said halogen atoms, at least one of them represents an N→O group, the remainings independently represent a CH group or a nitrogen atom, the maximum total number of the N→O groups represented by a, b, c, d, e, and f is 2, and the maximum total number of the nitrogen atoms is 3, particularly a dihalide derivative that is pyridine oxide, pyrazine monooxide and dioxide, and pyrimidine monooxide and dioxide, or pyridazine monooxide and dioxide, whose any of two hydrogen atoms are substituted with halogen atoms, which is represented by the formula (4a), (4b), (4c), or (4d):

(4a)
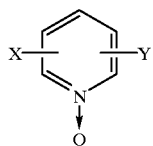

(4b)
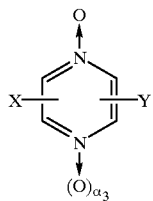

(4c)
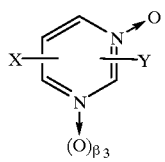

(4d)
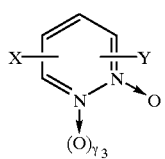

wherein X and Y each represents a halogen atom and $\alpha_3$, $\beta_3$, and $\gamma_3$ represent 0 or 1, with a zerovalent nickel compound.

N-oxidated poly(nitrogen-containing condensed heterocyclic ring) can be produced in the same manner as described above by reacting a dihalide derivative represented by the formula (10):

(10)
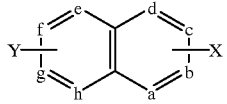

wherein X and Y each represents a halogen atom, two of any of a, b, c, d, e, f, g, and h represent carbon atoms that bind to said halogen atoms, at least one of them represents an N→O group, the remainings independently represent a CH group or a nitrogen atom, the maximum total number of the N→O groups represented by a, b, c, and d is 2, and the maximum total number of the nitrogen atoms is 3, the maximum total number of the N→O groups contained in e, f, g, and h is 2, and the maximum total number of the nitrogen atoms is 3, particularly a dihalide derivative in which any two hydrogen atoms of quinoline oxide, quinoxaline oxide, quinoxaline dioxide, 1,5-naphthyridine oxide, or 1,5-naphthyridine dioxide are substituted with halogen atoms and represented by the formula (10a), (10b-1), (10b-2), (10c-1), or (10c-2):

(10a)
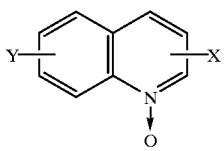

(10b-1)
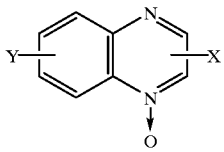

(10b-2)
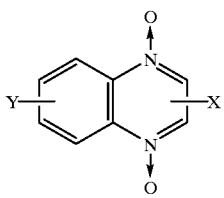

(10c-1)
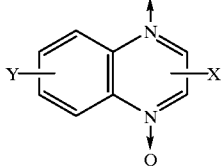

(10c-2)
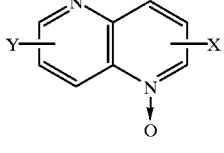

wherein X and Y each represents a halogen atom, with a zerovalent nickel compound.

According to the above production method (II), the polymer is obtained by reacting the dihalide derivative with an equimolar or more amount of a zerovalent nickel compound in an organic solvent to effect dehalogenation. A suitable reaction temperature is within room temperature to about 80° C. and the reaction completes for about 24 hours. As the above-described organic solvent, N,N-dimethylformamide, acetonitrile, toluene, tetrahydrofuran, and the like can be used.

The zerovalent nickel compound takes halogen from a haloaromatic compound to cause a coupling reaction between aromatic groups (for example, "Synthesis", page 736 (1984)).

This reaction can be shown by the reaction formula (A):

Ar—X+Ar'—X+NiL$_m$→Ar—Ar'+NiX$_2$L$_m$     (A)

wherein Ar and Ar' represent an aromatic group, X represents a halogen atom, and L represents a neutral ligand, thus NiL$_m$ represents a zerovalent nickel compound.

Accordingly, the polymer can be obtained by reacting an aromatic compound having two halogen atoms in the molecule, namely the above-described dihalide derivative with an equimolar or more amount of the zerovalent nickel compound to effect the dehalogenation reaction represented by the reaction formula (B) and the reaction formula (C):

$$2 \cdot Y\text{—}Ar''\text{—}X + NiLm \rightarrow Y\text{—}Ar''\text{—}Ar''\text{—}X + NiXYLm \quad (B)$$

$$Y\text{—}(Ar'')_{n_1}\text{—}X + Y\text{—}(Ar'')_{n_2}\text{—}X + NiLm \rightarrow Y\text{—}(Ar'')_{n_1+n_2}\text{—}X + NiXYLm \quad (C)$$

wherein Y—Ar"—X represents the above-described dihalide derivative.

In the above-described reaction, a zerovalent nickel compound that is synthesized in the reaction system (so-called in situ) immediately before the polymerization reaction can be used as it is as well as one synthesized and isolated in advance. Such a zerovalent nickel compound is, for example, a nickel complex produced by a reduction reaction or a ligand exchange reaction in the presence of a neutral ligand. Examples of the ligand include 1,5-cyclooctadiene, 2,2'-bipyridine, triphenylphosphine, and the like.

Production Method III

N-oxidated poly(nitrogen-containing heterocyclic ring) of the present invention can be produced by electrolytic reduction of a dihalide derivative represented by the formula (4) in which any two of hydrogen atoms of the nitrogen-containing heterocyclic compound, whose nitrogen atom constituting the ring is N-oxidated, are substituted with a halogen atoms:

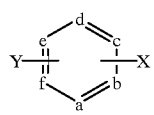

(4)

wherein X and Y each represents a halogen atom and any two of a, b, c, d, e, and f represent carbon atoms that are bound to the above-described halogen atom and at least one of them represents an N→O group, the remainings independently represent a CH group or a nitrogen atom, the maximum total number of the N→O group represented by a, b, c, d, e, and f is 2, and the maximum total number of the nitrogen atoms is 3, particularly the formula (4a), (4b), (4c), or (4d) in which any two of hydrogen atoms of pyridine oxide, pyrazine mono- and dioxide, pyrimidine mono- and dioxide, or pyridazine mono- and dioxide are substituted with halogen atoms:

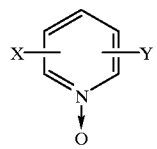

(4a)

(4b)

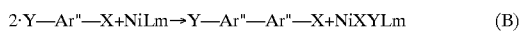

(4c)

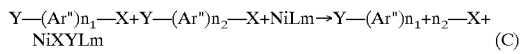

(4d)

wherein X and Y each represents a halogen atom and $\alpha_3$, $\beta_3$, and $\gamma_3$ represent 0 or 1, in the presence of a nickel compound.

N-oxidated poly(nitrogen-containing condensed heterocyclic ring) can be produced in the same manner as described above by electrolytic reduction of a dihalide derivative represented by the formula (10) in which any two of hydrogen atoms of a nitrogen-containing condensed heterocyclic compound, whose nitrogen atom constituting the ring is N-oxidated, are substituted with a halogen atom:

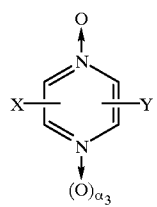

(10)

wherein X and Y each represents a halogen atom, any two of a, b, c, d, e, f, g, and h represent carbon atoms that bind to said halogen atoms, at least one of them represents an N→O group, the remainings independently represent a CH group or a nitrogen atom, the maximum total number of the N→O groups represented by a, b, c, and d is 2, and the maximum total number of the nitrogen atoms is 3, the maximum total number of the N→O groups represented by e, f, g, and h is 2, and the maximum total number of the nitrogen atoms is 3, particularly the formula (10a), (10b-1), (10b-2), (10c-1), or (10c-2) in which any two of the hydrogen atoms of quinoline oxide, quinoxaline oxide, quinoxaline dioxide, 1,5-naphthyridine oxide, or 1,5-naphthyridine dioxide are substituted with halogen atoms:

(10a)

(10b-1)

-continued

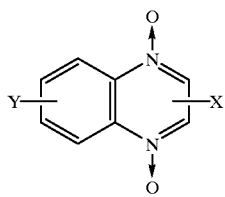
(10b-2)

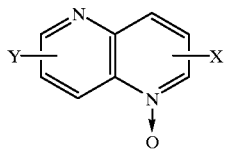
(10c-1)

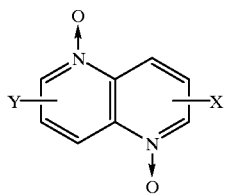
(10c-2)

wherein X and Y each represents a halogen atom, in the presence of a nickel compound.

In the above production method (III), when the dihalidederivative is subjected to the electrolytic reduction reaction in the presence of the divalent nickel compound, N-oxidated poly(nitrogen-containing heterocyclic ring) can be obtained by the dehalogenation reaction.

These reactions can be expressed by the reaction formula (D), (E), (F), and (G).

    (D)
    (E)
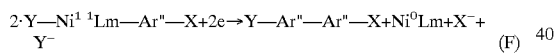    (F)
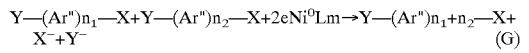    (G)

wherein Y—Ar"—X represents the above-described dihalide derivative.

A zerovalent nickel compound is formed by electrolytic reduction of a divalent nickel compound in an electrolytic reactor. Therefore, electrolytic reduction of an aromatic compound having two halogen atoms in the molecule, namely the above-described dihalide derivative in the presence of the divalent nickel compound results in formation of the zerovalent nickel compound and polymer can be obtained by the reaction involving $Ni^0Lm$ subsequently formed in the reaction system.

Electrolysis can be carried out under the usual conditions as described below. Namely, for example, N-dimethylformamide or acetonitrile is used as a solvent, tetraethylammonium perchlorate or tetraethylammonium tetrafluoroborate is dissolved as a supporting electrolyte to give an electrolytic solution, a platinum electrode, an ITO transparent electrode, or a graphite electrode is used as an electrode. The above-described dihalide derivative and the divalent nickel compound is dissolved in the electrolytic solution, followed by electrolytic reduction at a reduction potential of the divalent nickel compound (for example, −1.7 V (against $Ag/Ag^+$) when tris(2,2-bipyridine) nickel salt is used).

As the above nickel compound, one synthesized and isolated previously before the polymerization reaction may be used or one synthesized from nickel or a nickel compound directly in the electrolytic reactor may be used as it is. Such a nickel compound includes, for example, tris(2,2'-bipyridine) nickel bromide ($Ni(bpy)_3Br_2$), dibromobis (triphenylphosphin)nickel ($NiBr_2(PPh_3)_2$), and the like.

N-oxidated poly(nitrogen-containing heterocyclic ring) represented by the formula (1) or (2) according to the present invention:

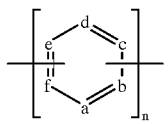
(1)

wherein a, b, c, d, e, and f have the same meaning as described above and the degree of polymerization n is at least 5,

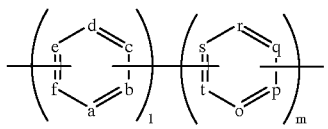
(2)

wherein a, b, c, d, e, f, o, p, q, r, s, and t have the same meaning as described above and the degree of polymerization l+m is at least 5,

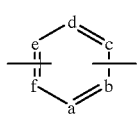
(5)

wherein a, b, c, d, e and f have the same meaning as described above,

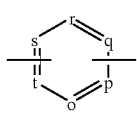
(6)

wherein o, p, q, r, s, and t have the same meaning as described above, is exemplified by the following in terms of the repeating units (5) and (6), but the present invention is not limited thereto.

Formula (5):

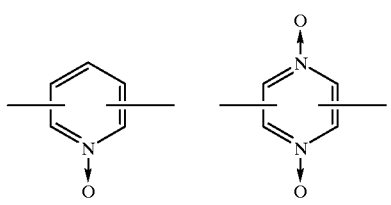

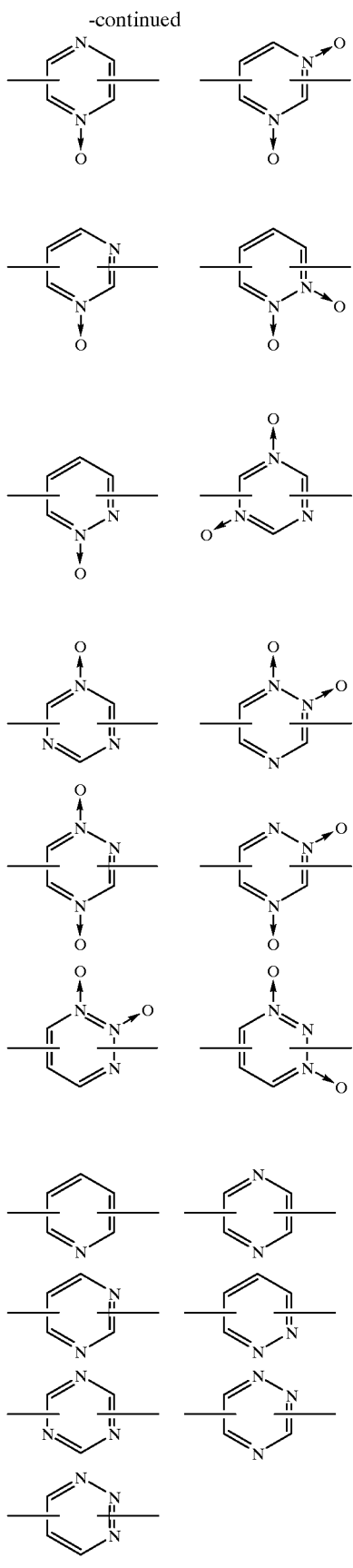

Further, N-oxidated poly(nitrogen-containing condensed heterocyclic ring) represented by the formula (7) or (8) according to the present invention:

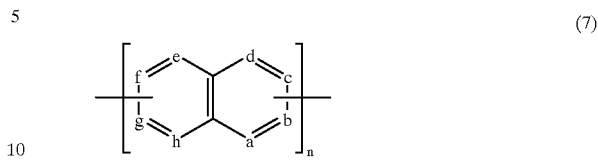

wherein a, b, c, d, e, f, g, and h have the same meaning as described above and the degree of polymerization n is at least 5,

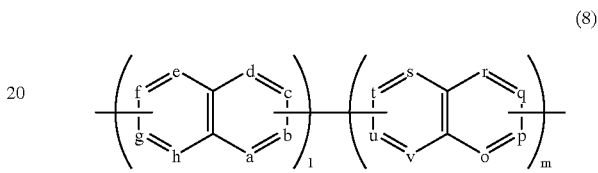

wherein a, b, c, d, e, f, g, h, o, p, q, r, s, t, u, and v have the same meaning as described above and the degree of polymerization l+m is at least 5, is exemplified by the repeating unit represented by the formulae (11) and (12):

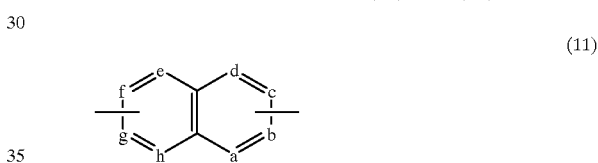

wherein a, b, c, d, e, f, g, and h have the same meaning as described above,

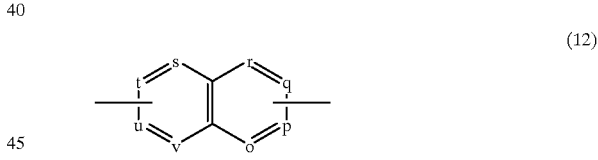

wherein o, p, q, r, s, t, u, and v have the same meaning as described above, but the present invention is not limited thereto.

Formula (11):

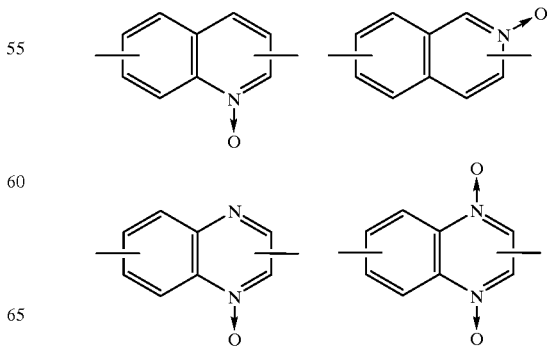

-continued
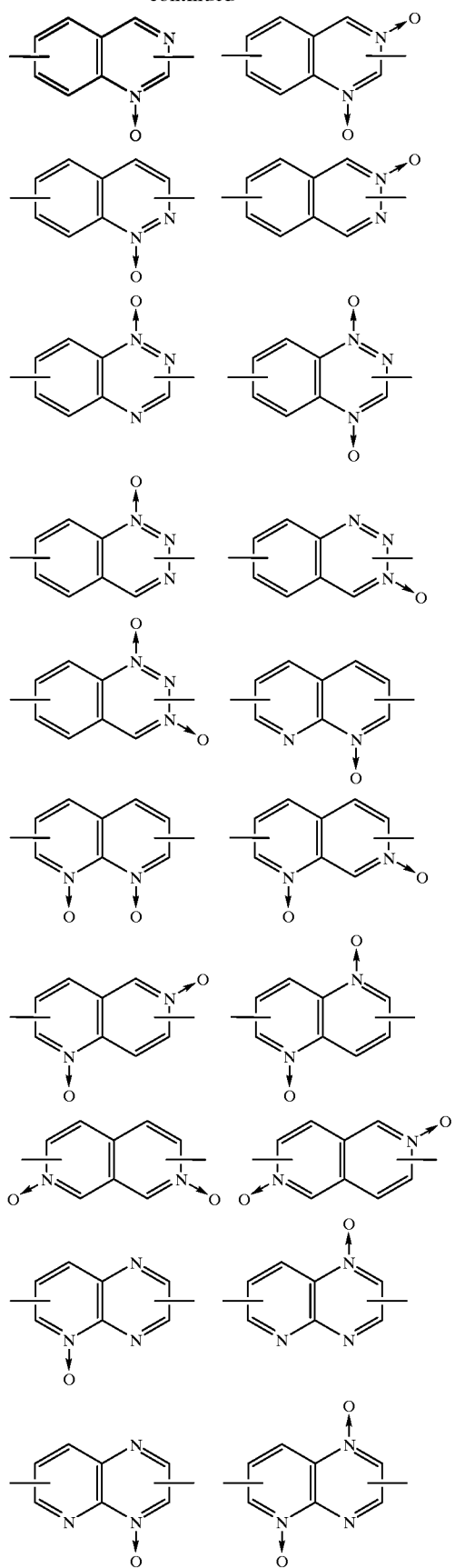
-continued
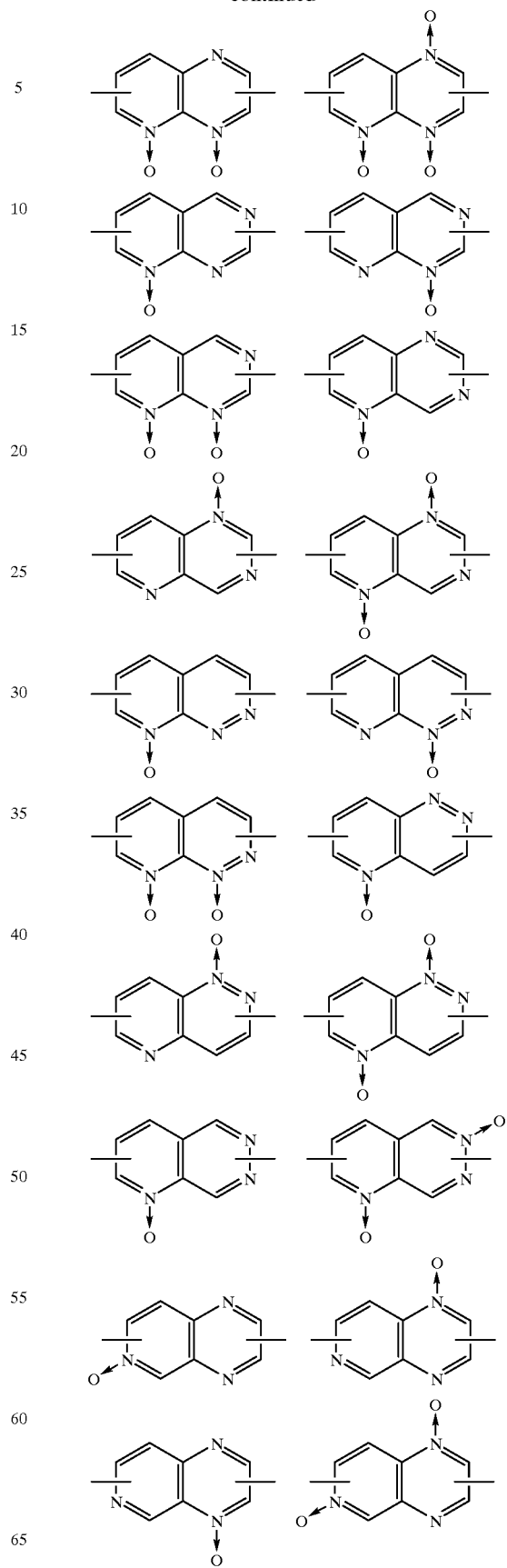

-continued
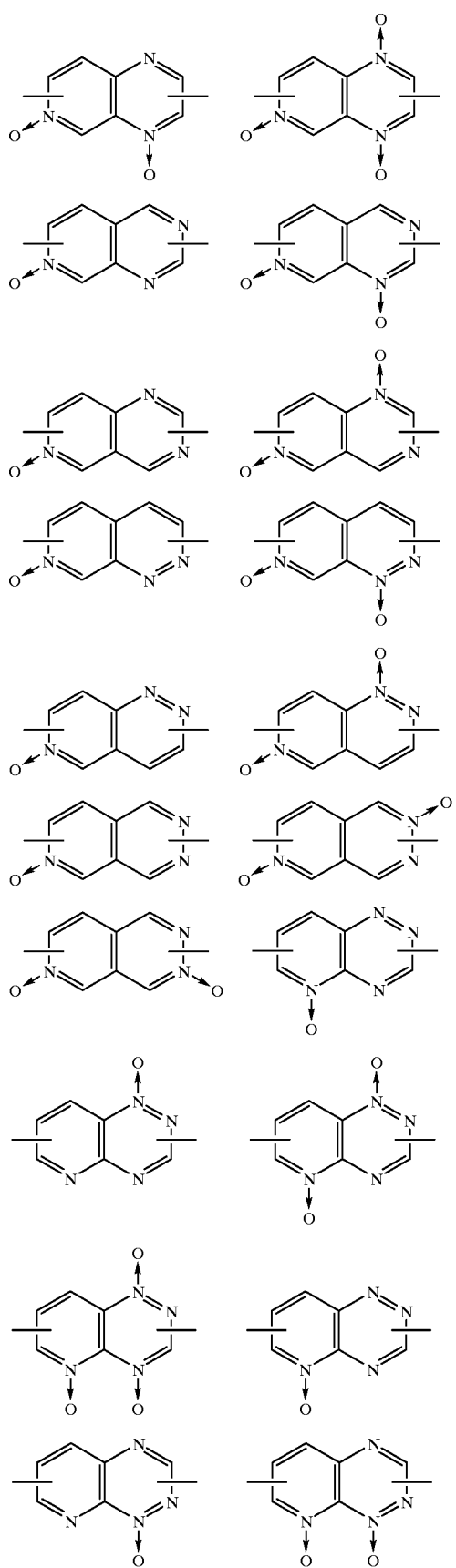
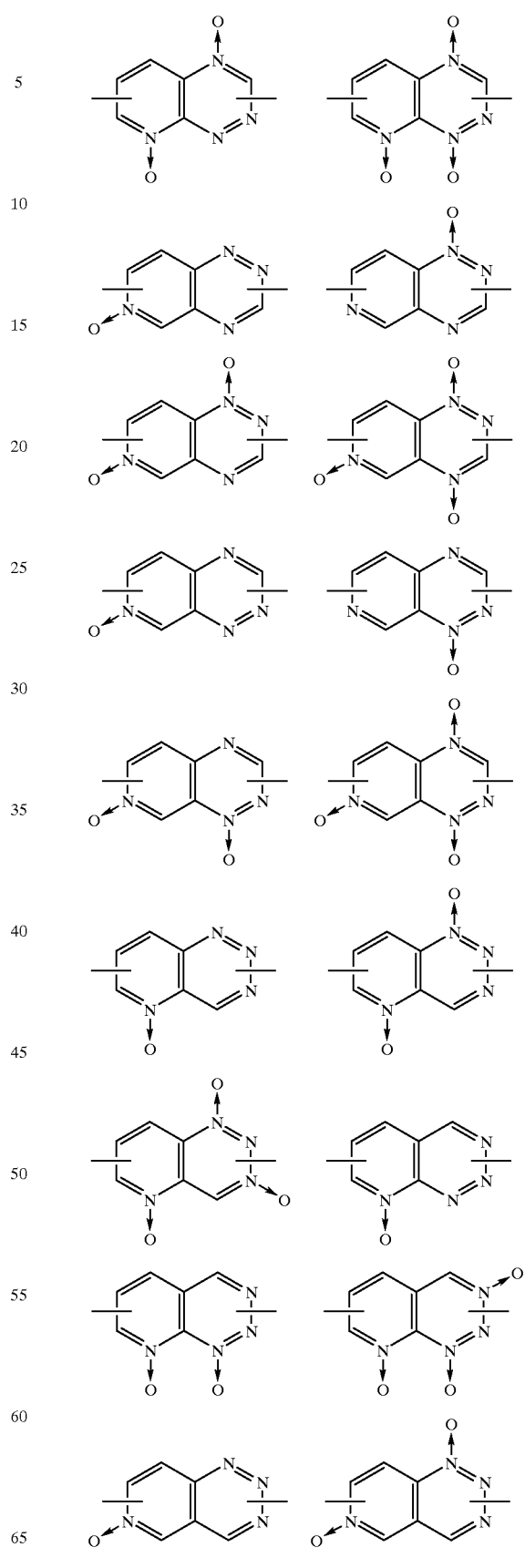

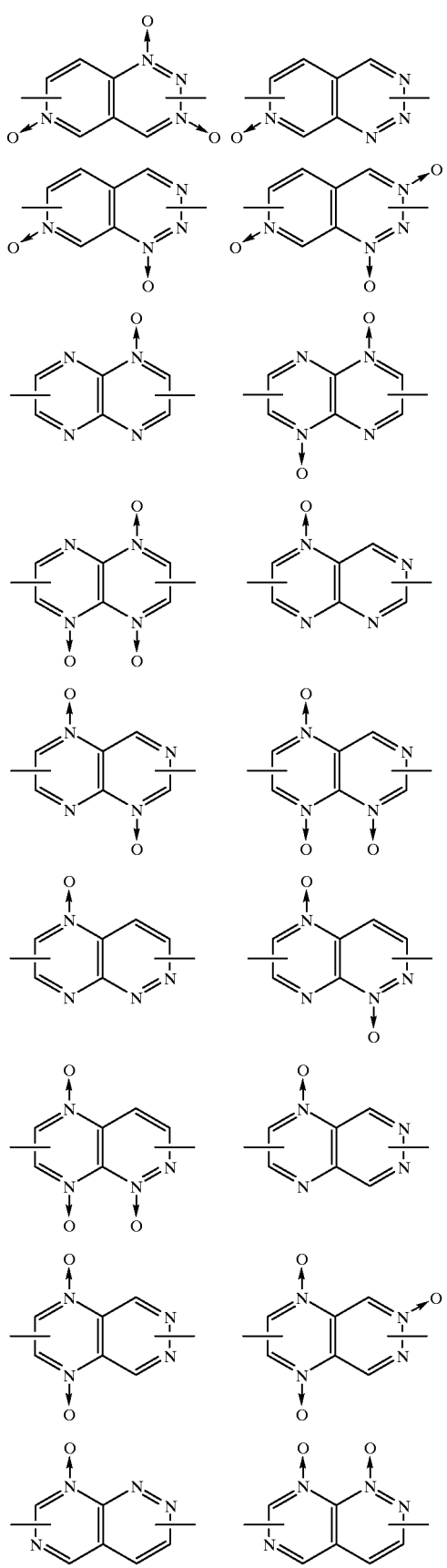
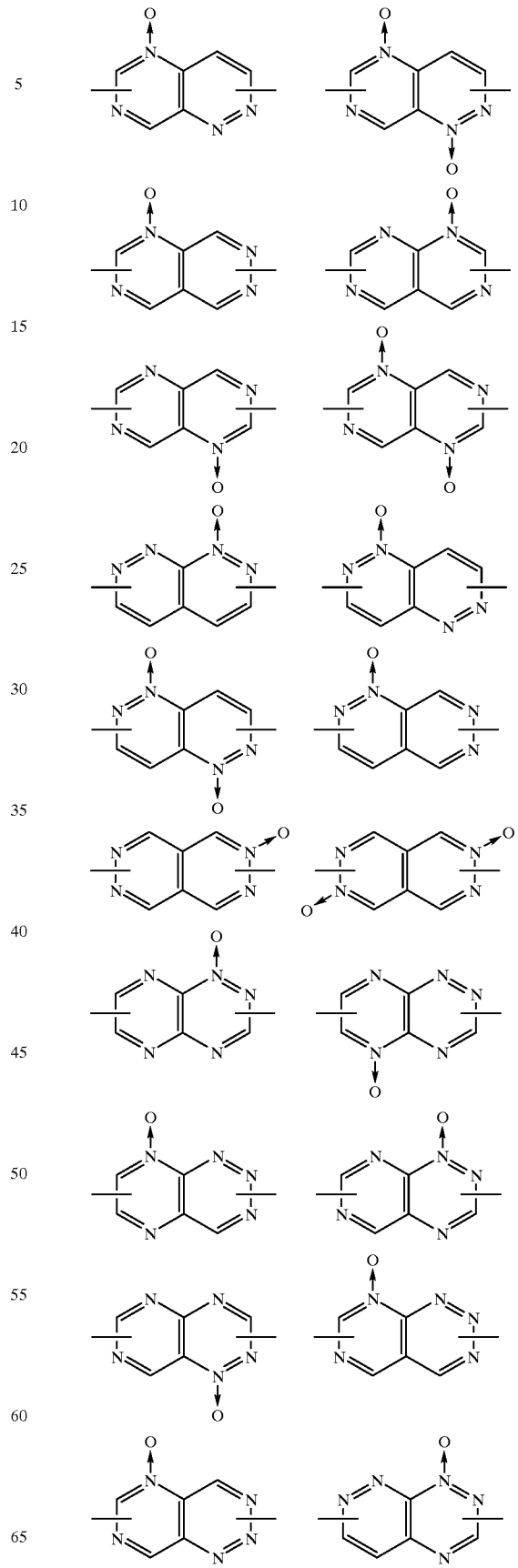

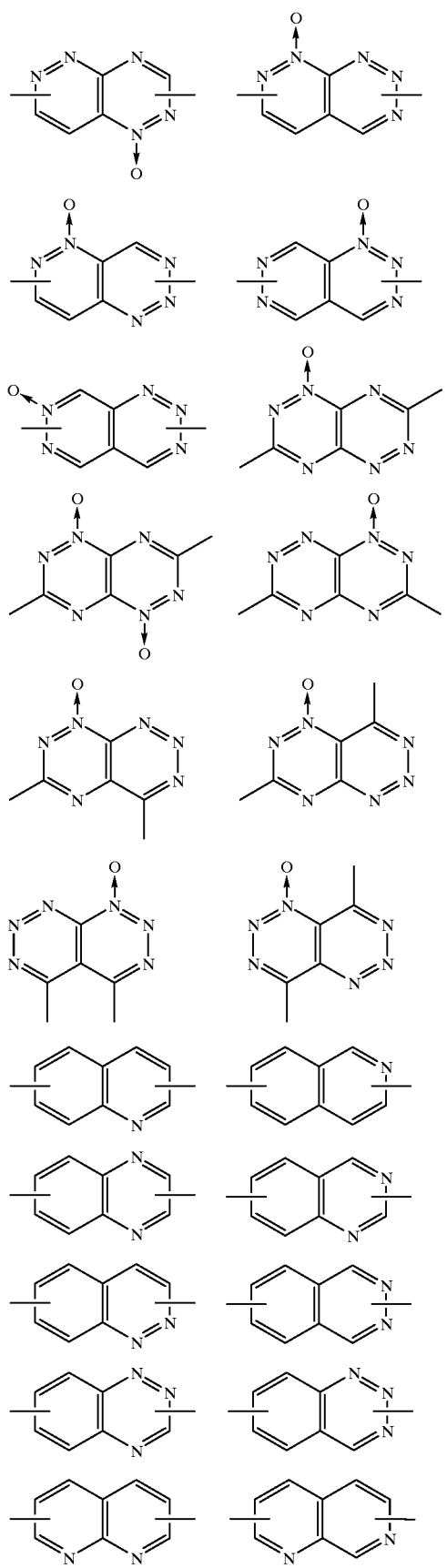

-continued

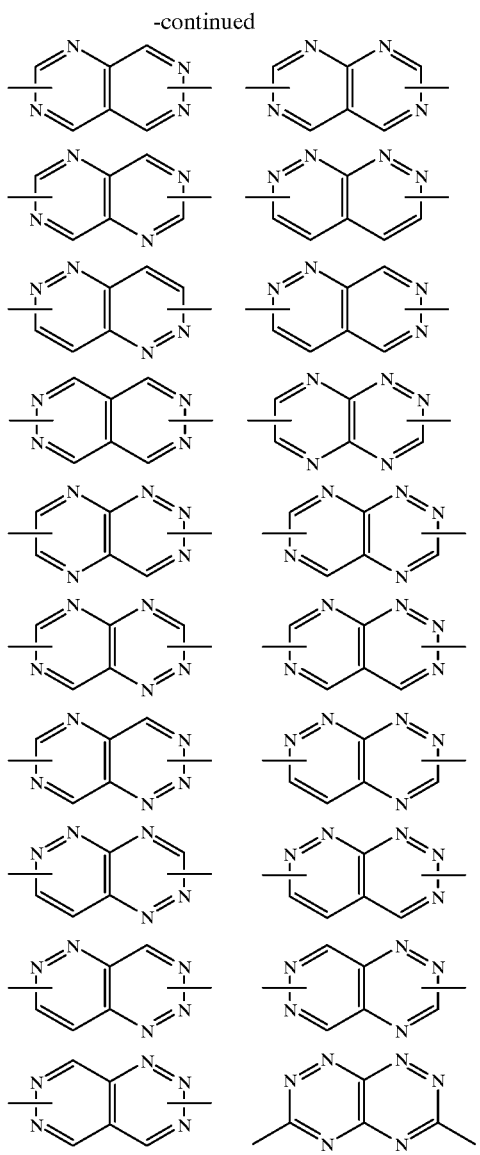

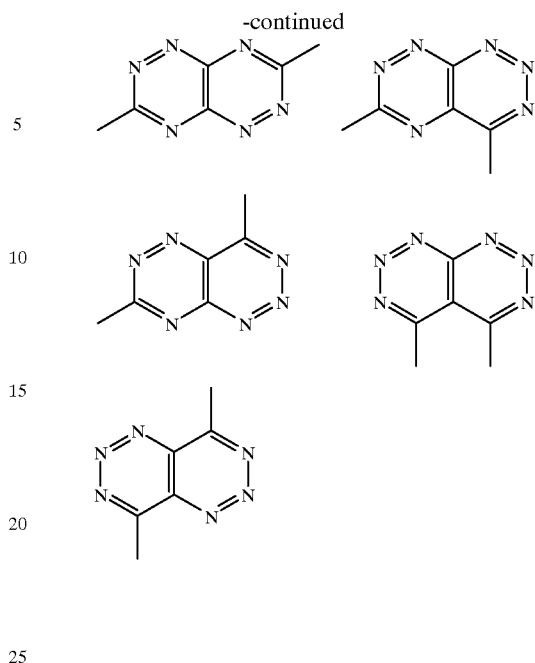

The N-oxidated poly(nitrogen-containing a heterocyclic ring) and the N-oxidated poly(nitrogen-containing condensed heterocyclic ring) have a resonance structure as shown as an example by the formulae (13) and (14) and the formulae (15) and (16). When including an adjacent unit, the structure having a quinoid type bond is formed and it is considered that such a resonance structure is spread in the whole polymer along the π conjugated system. In the formulae (13) and (14), " - - - " means that a macromolecular chain is bound to the left and right sides.

The change of the main chain structure produced by the quinoid structure is analogous to the change in structure during the doping reaction.

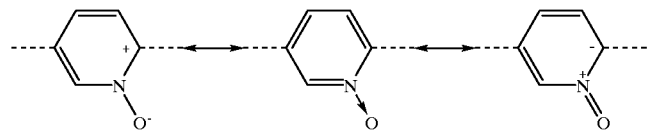

(13)

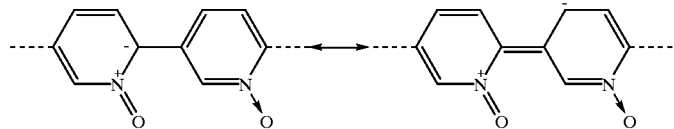

(14)

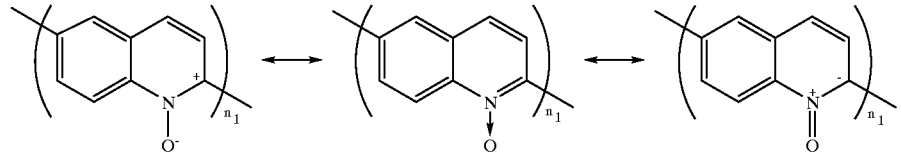

(15)

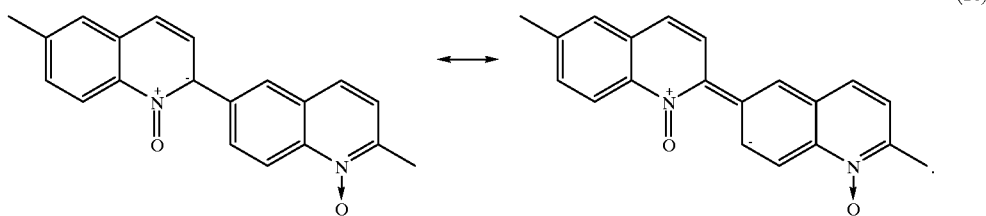

(16)

The polymer of the present invention can be applied to fibers or films, electrochromic device, semiconductors, and active materials or electrodes of battery, making use of its excellent properties. Also, the compound of the present invention has conductivity by itself and further, is reduced by a reducing agent or by electrochemical doping to utilize as n-type semiconductor. Furthermore, when the polymer of the present invention is molded into a molding product, such as fiber, film or the like, such as a heat stabilizer, a photostabilizer, a filler, or a reinforcing agent can be mixed appropriately.

MODE FOR CARRYING OUT THE INVENTION

Figure 1:
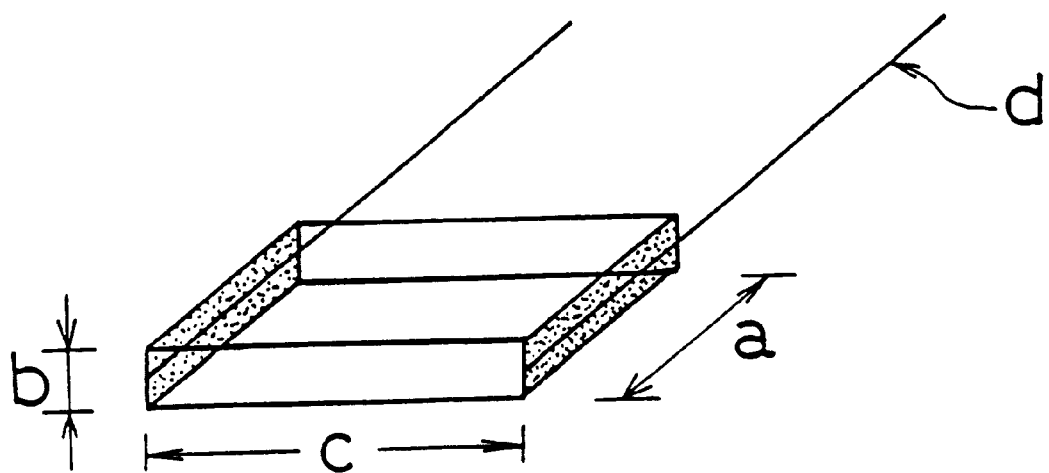
FIG. 1 shows the resistance measuring device based on the two probe method used in Examples 4 to 6.

The present invention will be described below specifically and in detail with reference to Examples, but is not limited thereto.

EXAMPLE 1

Synthesis of poly(pyridine-2,5-diyl)

Twenty ml of N,N-dimethylformamide was added to 1.53 g (5.74 mmol) of bis(1,5-cycroctadiene)nickel under nitrogen atmosphere. Further, 0.62 g of 1,5-cyclooctadiene, 0.87 g (5.8 mmol) of 2,2'-bipyridine, and 1.1 g (4.6 mmol) of 2,5-dibromopyridine were added thereto and the mixture was stirred at 60° C. for 8 hours under heating. The polymer thus formed was washed with hot toluene, a warm aqueous solution of ethylenediaminetetraacetic acid (once each at pH 3 and pH 9), a warm aqueous solution of NaOH (pH=9), warm water, and hot benzene, followed by drying under reduced pressure. Thus, yellow poly(pyridine-2,5-diyl) having a molecular weight (Mw) of 4300 and the degree of polymerization of 49, and represented by the formula (3a-A):

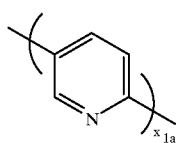

(3a-A)

wherein $x_1$ a represents the degree of polymerization, was obtained in a yield of approximately 100%.

Synthesis of poly(pyridine-1-oxide-2,5-diyl)

One hundred mg of poly(pyridine-2,5-diyl) was suspended in 20 ml of glacial acetic acid and 8 ml of a 30% hydrogen peroxide aqueous solution was added dropwise thereto at room temperature, followed by stirring at 60° C. for 3 days. After allowing the mixture to cool, the yellowish brown solid thus formed was filtered under reduced pressure and the resulting solid was successively washed with an aqueous solution of sodium hydroxide, an aqueous solution of hydrochloric acid, and water, followed by drying under reduced pressure. Thus, poly(pyridine-1-oxide-2,5-diyl) represented by the formula (1a-A):

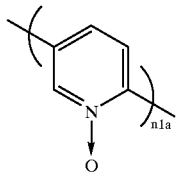

(1a-A)

wherein $n_1$ a represents the degree of polymerization, was obtained in the form of yellowish brown powder in a yield of 28%. The reason why the yield was low is considered that a part of the product was lost during washing or the other steps when the polymer was purified to improve its solubility as described below.

The elemental analysis of the polymer represented by theformula (1a-A) resulted in carbon: 53.2%; hydrogen: 3.8%; and nitrogen: 12.1%, which was a polymer (calculated: carbon: 53.6%; hydrogen: 4.6%; nitrogen: 12.5%, and oxygen: 29.3%) containing 1.05 water molecule per monomer unit and having a constituting unit represented by the formula:

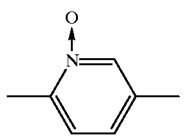

which revealed that N-oxidation proceeded approximately 100%. The degree of polymerization of the polymer was 49.

Comparing the characteristics of infrared absorption spectrum (IR spectrum, KBr pellet method) and ultraviolet visible absorption spectrum (UV spectrum, in a formic acid solution) of the polymer of formula (1a-A) with those of the polymer of formula (3a-A), IR spectrum of the former shows absorption of the pyridine skeleton at 1,400 to 1,600 cm$^{-1}$ that was slightly broader and absorption intensity that was also changed. Further, there observed absorption of N-oxide at about 1,240 cm$^{-1}$ and broad shoulder absorption of water attached to the polymer at about 1,650 cm$^{-1}$.

On the other hand, UV spectrum showed the maximum absorbed wave length of the polymer of the formula (1a-A) at 330 nm in formic acid. Comparing this value with the maximum absorbed wave length of the polymer of the formula (3a-A), it was found that the maximum absorbed wave length was shifted by 50 nm toward the short wave length side by N-oxidation.

Solubility in various solvents of the polymer represented by the formula (1a-A) was studied using 1 mg of the polymer and 1 ml of a solvent at room temperature. As a result, the polymer was soluble in 28% aqueous ammonia, formic acid, sulfuric acid, N,N-dimethylformamide (DMF), N-methylpyrrolidone (NMP), dimethylsulfoxide (DMSO), and the like. Thus, solubility in solvents of this polymer was superior to that of the polymer represented by the formula (3a-A) (which is soluble in formic acid and sulfuric acid, but was insoluble in usual organic solvents such as DMF, NMP, DMSO, or the like).

EXAMPLE 2

Synthesis of poly(quinoline-2,6-diyl)

Thirty ml of N,N-dimethylformamide was added to 0.67 g (2.43 mmol) of bis(7,5-cyclooctadiene)nickel under nitrogen atmosphere. Further, 0.35 ml of 1,5-cyclooctadiene, 0.30 g (1.92 mmol) of 2,2'-bipyridine, and 0.32 g (1.59 mmol) of 2,6-dichloroquinoline were added thereto and the mixture was stirred at 60° C. for 48 hours under heating. The polymer thus formed was washed twice with aqueous ammonia, three times with an aqueous solution of ethylenediaminetetraacetic acid, twice with aqueous ammonia, once with water, and once with methanol, followed by drying under reduced pressure. Thus, yellow poly(quinoline-2,6-diyl) having a molecular weight (Mw) of 15,000 and the degree of polymerization of 118, and represented by the formula (9a-A):

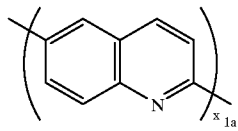

(9a-A)

wherein $x_1$ a represents the degree of polymerization, was obtained in a yield of 99%.

Synthesis of poly(quinoline-1-oxide-2,6-diyl)

One hundred mg of poly(quinoline-2,6-diyl) was suspended in 20 ml of glacial acetic acid and 8 ml of a 30% hydrogen peroxide aqueous solution was added dropwise thereto at room temperature, followed by stirring at 60° C. for 3 days. After allowing the mixture to cool, the orange solid thus formed was filtered under reduced pressure and the resulting solid was successively washed with an aqueous solution of sodium hydroxide, an aqueous solution of hydrochloric acid, and water, followed by drying under reduced pressure. Thus, poly(quinoline-1-oxide-2,6-diyl) represented by the formula (7a-A):

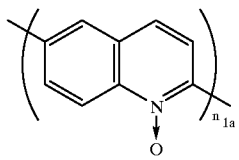

(7a-A)

wherein $n_1$ a represents the degree of polymerization, was obtained in the form of yellowish brown powder in a yield of 21%. The reason why the yield was low is considered that a part of the product was lost during washing or the other steps when the polymer was purified to improve its solubility as described below.

The elemental analysis of the polymer represented by theformula (7a-A) resulted in carbon: 71.0%; hydrogen: 3.7%; and nitrogen: 9.2%, which was a polymer (calculated: carbon: 71.1%; hydrogen: 4.0%; nitrogen: 9.2%, and oxygen: 15.7%) containing 0.49 water molecule per monomer unit and having a constituting unit represented by the formula:

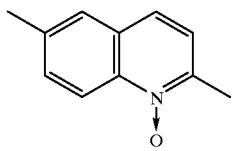

which revealed that N-oxidation proceeded approximately 100%. The degree of polymerization was 118.

Comparing the characteristics of infrared absorption spectrum (IR spectrum, KBr pellet method) and ultraviolet visible absorption spectrum (UV spectrum, in a formic acid solution) of the polymer of formula (7a-A) with those of the polymer of formula (9a-A), IR spectrum of the former showed absorption of the quinoline skeleton at 1,400 to 1,600 cm$^{-1}$ that was slightly broader and absorption intensity that was also changed. Further, there observed absorption of N-oxide at about 1,240 cm$^{-1}$ and broad shoulder absorption of water attached to the polymer at about 1,650 cm$^{-1}$.

On the other hand, UV spectrum showed the maximum absorption wave length of the polymer of the formula (7a-A) at 407 nm in formic acid. Comparing this value with the maximum absorbed wave length of the polymer of the formula (9a-A), it was found that the maximum absorbed wave length was shifted by 30 nm toward the short wave length side by N-oxidation.

Solubility in various solvents of the polymer represented by the formula (7a-A) was studied using 1 mg of the polymer and 1 ml of a solvent at room temperature. As a result, the polymer was soluble in water, an aqueous solution of sodium hydroxide, formic acid, sulfuric acid, N,N-dimethylformamide (DMF), N-methylpyrrolidone (NMP), dimethylsulfoxide (DMSO), and the like. Thus, solubility in solvents of this polymer was superior to that of the polymer represented by the formula (9a-A) (which was soluble in formic acid and sulfuric acid, but is insoluble in usual organic solvents such as DMF, NMP, DMSO, or the like).

Further, proton NMR spectrum of poly (quinoline-1-oxide-2,6-diyl) (7a-A) obtained in this Example was compared with that of the starting material, poly(quinoline-2,6-diyl) (9a-A). Both spectra were measured in trifluoroacetic acid-d$^1$. As a result, absorption (delta about 9.4 ppm) of proton at position 4 of the polymer of the formula (9a-A)

disappeared, while, in the case of the polymer of the formula (7a-1), absorption at delta about 9.6 ppm and delta about 9.34 ppm newly appeared, which revealed that the electric structure of the quinoline has been changed widely.

EXAMPLE 3

Synthesis of poly(naphthyridine-2,6-diyl)

Twelve ml of N,N-dimethylformamide was added to 0.18 g (0.65 mmol) of bis(7,5-cyclooctadiene)nickel under nitrogen atmosphere. Further, 0.14 ml of 1,5-cyclooctadiene, 0.11 g (0.72 mmol) of 2,2'-bipyridine, and 0.11 g (0.53 mmol) of 2,6-dichloro-1,5-naphthyridine were added thereto and the mixture was stirred at 60° C. for 48 hours under heating. The polymer thus formed was washed in the same manner as in Example 2.

Thus, yellow poly(naphthyridine-2,6-diyl) represented by the formula (9c-A):

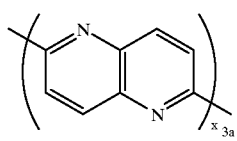

(9c-A)

wherein $x_1$ a represents the degree of polymerization, was obtained in a yield of 97%. The result of halogen analysis (0.3%) revealed that the molecular weight and the degree of polymerization of the polymer were 23,700 and 185, respectively.

Synthesis of poly(naphthyridine-1,5-dioxide-2,6-diyl)

Seventy mg of poly(naphthyridine-2,6-diyl) was suspended in 20 ml of glacial acetic acid and 8 ml of a 30% hydrogen peroxide aqueous solution was added dropwise thereto at room temperature, followed by stirring at 60° C. for 3 days. After allowing the mixture to cool, the orange solid thus formed was filtered under reduced pressure and the resulting solid was successively washed with an aqueous solution of sodium hydroxide, an aqueous solution of hydrochloric acid, and water. Then, the solid was dried under reduced pressure to obtain poly(naphthyridine-1,5-dioxide-2,6-diyl) represented by the formula (7c-2-A):

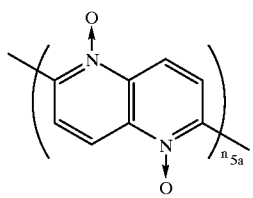

(7c-2-A)

wherein $n_5$ a represents the degree of polymerization, was obtained in the form of reddish brown powder in a yield of 33%. The elemental analysis of the polymer represented by the formula (7c-2-A) resulted in carbon: 56.3%; hydrogen: 2.9%; and nitrogen 16.4%, which was a polymer (calculated: carbon: 57.4%; hydrogen: 2.9%; nitrogen: 16.7%, and oxygen: 23.0%) containing 0.41 water molecule per monomer unit and having a constituting unit represented by the formula:

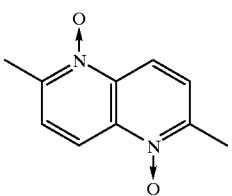

which revealed that N-oxidation proceeded approximately 100%. The degree of polymerization was 185.

Comparing the characteristics of infrared absorption spectrum (IR spectrum, KBr pellet method) and ultraviolet visible absorption spectrum (UV spectrum, in a formic acid solution) of the polymer of formula (7c-2-A) with those of the polymer of formula (9c-A), IR spectrum of the former shows absorption of the 1,5-naphthyridine skeleton at 1,400 to 1,600 cm$^{-1}$ that was slightly broader and absorption intensity that was also changed. Further, there observed absorption of N-oxide at about 1,237 cm$^{-1}$ and broad shoulder absorption of water attached to the polymer at about 1,600 to 1,700 cm$^{-1}$.

On the other hand, UV spectrum showed the maximum absorbed wave length of the polymer of the formula (7c-2-A) at 404 nm in formic acid. Comparing this value with the maximum absorbed wave length of the polymer of the formula (9c-A), it was found that the maximum absorbed wave length was shifted by 35 nm toward the short wave length side by N-oxidation.

EXAMPLE 4

Electric conductivity of poly(pyridine-1-oxide-2,5-diyl) represented by the formula (1a-A) obtained in Example 1 was measured by subjecting the polymer to press molding in a good state to give pellet using a press molding machine, cutting the resulting pellet in a shape of rectangle, and fixing between two platinum electrodes d with carbon paste as shown in FIG. 1 (two probe method).

The lengths of a, b, and c (cm) referred to in FIG. 1 were respectively measured, the value of resistance R ($\Omega$) was measured, and electric conductivity was calculated by the following formula:

$$\sigma[Scm^{-1}]=c/(abR)$$

As a result, the polymer showed electric conductivity of $3.4 \times 10^{-6}$ Scm$^{-1}$, which was 8 orders or more higher than electric conductivity ($10^{-14}$ σ/Scm$^{-1}$ or lower) of the polymer represented by the formula (3a-A).

Figure 2:
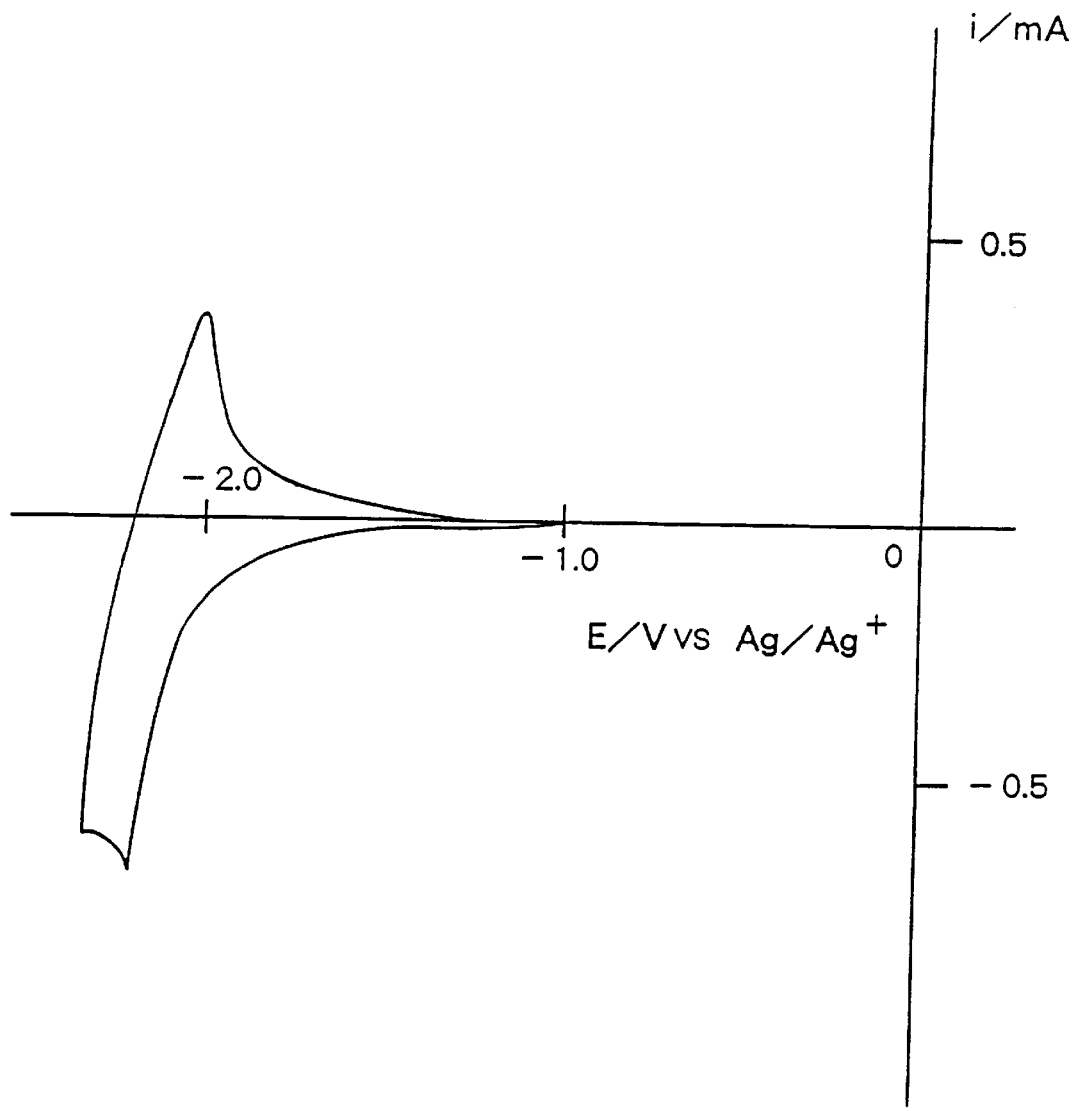
FIG. 2 shows cyclicvoltamogram obtained in Example 4.

Further, cyclicvoltamogram (CV) of the polymer of formula(1a-A) that was casted with formic acid on the platinum electrodes was measured (FIG. 2).

The peak potentials obtained by cation doping and dedoping were $E_{p\,c}=-2.22$ V, $E_{p\,a}=-2.00$ V (each against Ag/Ag$^+$), respectively. The color of the polymer turned from yellow to dark brown by doping.

EXAMPLE 5

Electric conductivity of poly(quinoline-1-oxide-2,6-diyl) represented by the formula (7a-A) obtained in Example 2 was measured by subjecting the polymer to pressure molding in a good state to give pellet using a pressure molding machine, cutting the resulting pellet in a shape of rectangle, and fixing between two platinum electrodes d with carbon paste as shown in FIG. 1 (two terminal method).

The lengths of a, b, and c (cm) referred to in FIG. 1 were respectively measured, the value of resistance R ($\Omega$) was measured, and electric conductivity was calculated by the following formula:

$$\sigma[Scm^{-1}]=c/(abR)$$

As a result, the polymer showed electric conductivity of $2.3\times10^{-6}$ Scm$^{-1}$, which was about 4 orders higher than electric conductivity ($4.0\times10^{-10}$ Scm$^{-1}$) of the polymer represented by the formula (9a-A).

Figure 3:
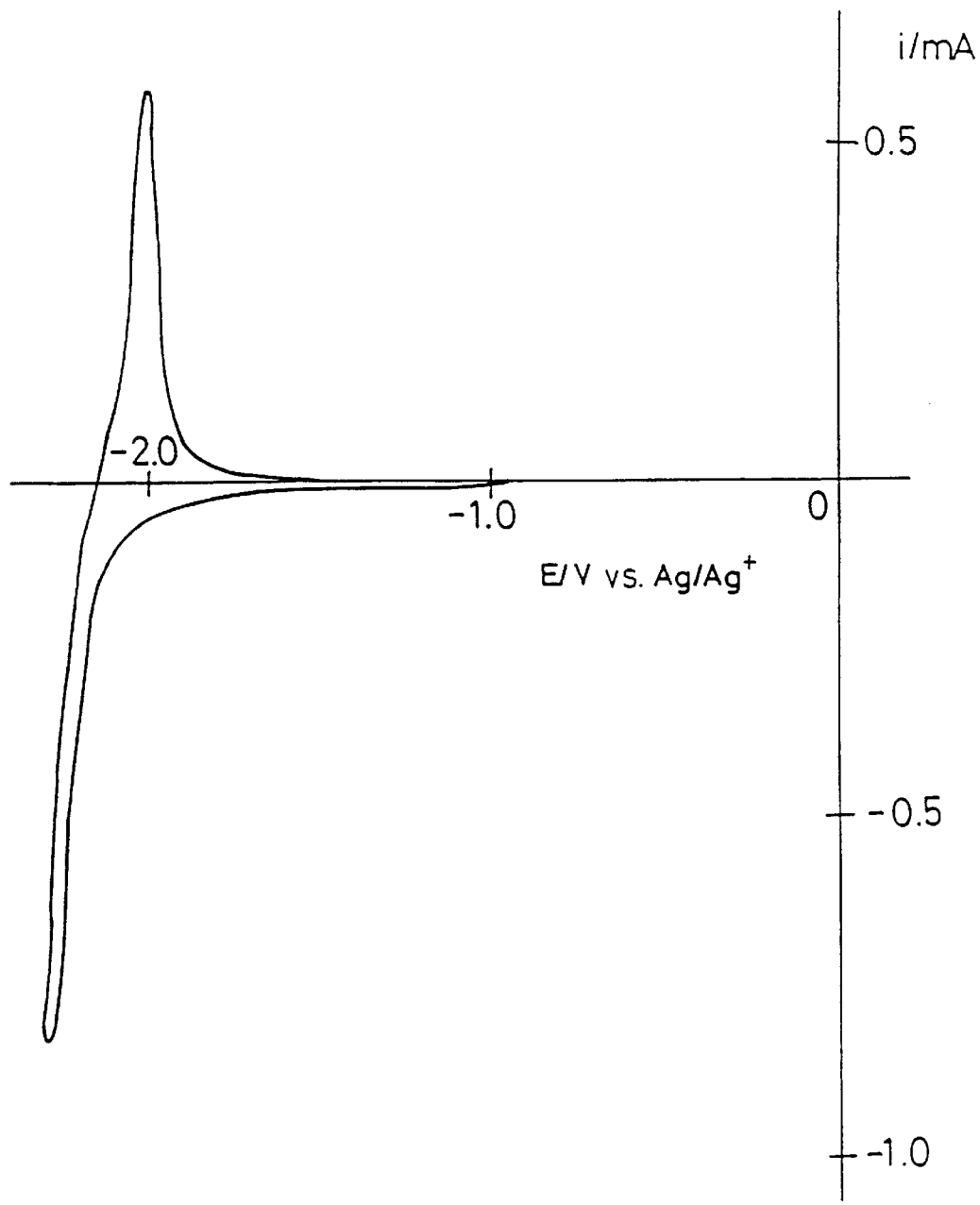
FIG. 3 shows cyclicvoltamogram obtained in Example 5.

Further, cyclic voltagram (CV) of the polymer of formula (7a-A) that was casted with formic acid on the platinum electrodes was measured (FIG. 3).

The peak potentials obtained by cation doping and dedoping were $E_{p,c}=-2.31$ V, $E_{p,a}=-2.00$ V (each against Ag/Ag$^+$), respectively. The color of the polymer turned from yellow to violet by doping.

EXAMPLE 6

Electric conductivity of poly(naphthyridine-1,5-dioxide-2,6-diyl) represented by the formula (7c-2-A) obtained in Example 3 was measured in the same manner as in Example 5.

As a result, the polymer showed electric conductivity of $3.2\times10^{-6}$ Scm$^{-1}$, which was about 3 orders higher than electric conductivity ($1.1\times10^{-9}$ Scm$^{-1}$) of the polymer represented by the formula (9c-A).

The novel N-oxidated poly(nitrogen-containing heterocyclic ring), particularly N-oxidated poly(pyridinediyl), and N-oxidated poly(nitrogen-containing condensed heterocyclic ring), particularly N-oxidated poly(quinolinediyl), poly(quinoxalinediyl), or poly(naphthyridinediyl), have heat resistance and are soluble in aqueous or organic solvents. Accordingly, they can be applied in various fields and used widely. They are dissolved in an appropriate solvent and the resulting solution can be converted into fibers, films, and the like by dry molding. These polymers also have such excellent properties that their degree of depolarization and electrochemical oxidation-reduction potential can be controlled depending on their structure, which properties cannot be found in the conventional poly(arylene).

Further, according to the method of the present invention, it is possible to synthesize a macromolecule in which charges resulted from N-oxidation are nonlocalized along the π conjugated system. It was found that the macromolecule of the present invention has conductivity by itself.

What is claimed is:

1. N-oxidated poly(nitrogen-containing heterocyclic ring) containing a polymer chain represented by the formula (1):

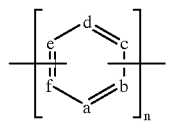

(1)

wherein any two of a, b, c, d, e, and f represent carbon atoms that are involved in binding between repeating units, at least one of them represents an N→O group, the remainings independently represent a CH group or a nitrogen atom, the maximum total number of the N→O groups represented by a, b, c, d, e, and f is 2, the maximum total number of the nitrogen atoms is 3, and the degree of polymerization n is at least 5.

2. N-oxidated poly(nitrogen-containing heterocyclic ring) containing a polymer chain represented by the formula (2):

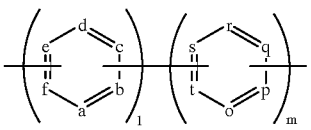

(2)

wherein any two of a, b, c, d, e, and f represent carbon atoms that are involved in binding between repeating units, at least one of them represents an N→O group, the remainings independently represent a CH group or a nitrogen atom, the maximum total number of the N→O groups represented by a, b, c, d, e, and f is 2, the maximum total number of the nitrogen atoms is 3, any two of o, p, q, r, s, and t represent carbon atoms that are involved in binding between repeating units, the remainings independently represents a CH group or a nitrogen atom, the maximum total number of the nitrogen atoms contained in o, p, q, r, s, and t is 3, and the degree of polymerization l+m is at least 5.

3. The N-oxidated poly(nitrogen-containing heterocyclic ring) as claimed in claim 1, wherein said formula (1) is the formula (1a), (1b), (1c), or (1d):

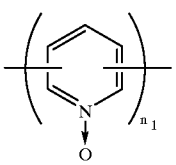

(1a)

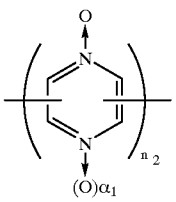

(1b)

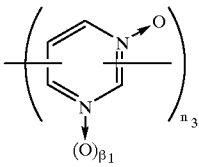

(1c)

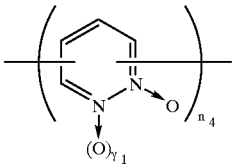

(1d)

wherein the degree of polymerization $n_1$, $n_2$, $n_3$, and $n_4$ represent at least 5 and $\alpha_1$, $\beta_1$, and $\gamma_1$ represent 0 or 1.

4. The N-oxidated poly(nitrogen-containing heterocyclic ring) as claimed in claim 2, wherein said formula (2) is the formula (2a), (2b), (2c), or (2d):

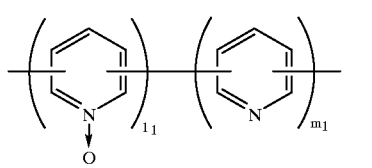
(2a)

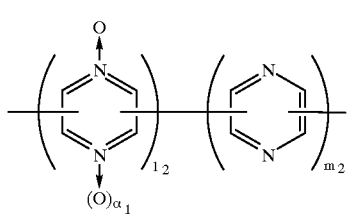
(2b)

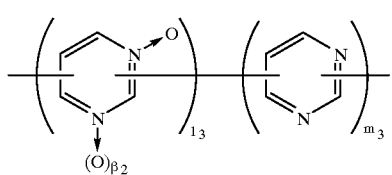
(2c)

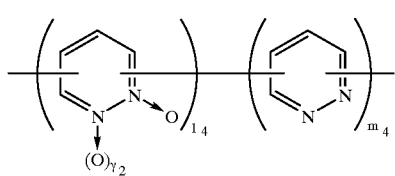
(2d)

wherein the degree of polymerization $1_1+m_1$, $1_2+m_2$, $1_3+m_3$, and $1_4+m_4$ represent at least 5 and $\alpha_2$, $\beta_2$, and $\gamma_2$ represent 0 or 1.

5. A method of producing the N-oxidated poly(nitrogen-containing heterocyclic ring) as claimed in claim 4, which comprises reacting poly(nitrogen-containing heterocyclic ring) containing a polymer chain represented by the formula (3):

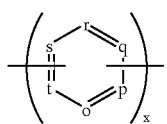
(3)

wherein o, p, q, r, s, and t have the same meaning as described above and the degree of polymerization x represents at least 5, with peroxide to N-oxidate the nitrogen atom in the ring.

6. A method of producing the N-oxidated poly(nitrogen-containing heterocyclic ring) as claimed in claim 4, which comprises reacting a dihalide derivative represented by the formula (4)

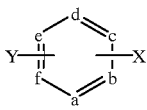
(4)

wherein X and Y represent a halogen atom, any two of a, b, c, d, e, and f represent carbon atoms that bind to said halogen atoms, at least one of them represents an N→O group, the remainings independently represent a CH group or a nitrogen atom, the maximum total number of the N→O groups represented by a, b, c, d, e, and f is 2, and the maximum total number of the nitrogen atoms is 3, with a zerovalent nickel compound.

7. A method of producing the N-oxidated poly(nitrogen-containing heterocyclic ring) as claimed in claim 4, which comprises subjecting a dihalide derivative represented by the formula (4):

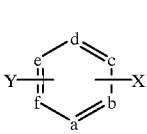
(4)

wherein X and Y represent a halogen atom, any two of a, b, c, d, e, and f represent carbon atoms that bind to said halogen atoms, at least one of them represents an N→O group, the remainings independently represent a CH group or a nitrogen atom, the maximum total number of the N→O groups represented by a, b, c, d, e, and f is 2, and the maximum total number of the nitrogen atoms is 3, to electrolytic reduction in the presence of a nickel compound.

8. The method of producing the N-oxidated poly(nitrogen-containing heterocyclic ring) as claimed in claim 5, wherein said formula (3) is the formula (3a), (3b), (3c), or (3d):

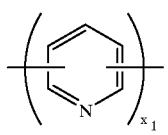
(3a)

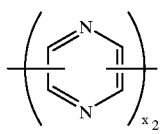
(3b)

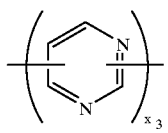
(3c)

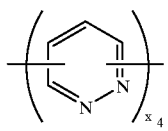
(3d)

wherein the degree of polymerization $x_1$, $x_2$, $x_3$, and $x_4$ represent at least 5.

9. The method of producing the N-oxidated poly (nitrogen-containing heterocyclic ring) as claimed in claim 6, wherein said formula (4) is the formula (4a), (4b), (4c), or (4d):

(4a)

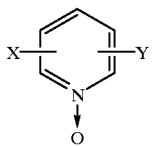

(4b)

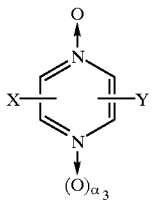

(4c)

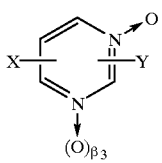

(4d)

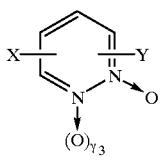

wherein X and Y each represents a halogen atom and $\alpha_3$, $\beta_3$, and $\gamma_3$ represent 0 or 1.

10. The method of producing the N-oxidated poly (nitrogen-containing heterocyclic ring) as claimed in claim 7, wherein said formula (4) is the formula (4a), (4b), (4c), or (4d):

(4a)

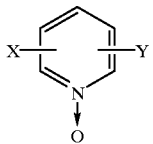

(4b)

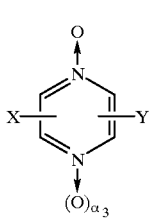

(4c)

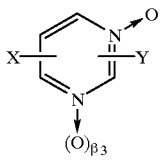

(4d)

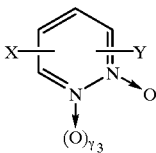

wherein X and Y each represents a halogen atom and $\alpha_3$, $\beta_3$, and $\gamma_3$ represent 0 or 1.

11. A fiber or film which is made of the N-oxidated poly(nitrogen-containing heterocyclic ring) as claimed in claim 1.

12. An electrochromic element which is made of the N-oxidated poly(nitrogen-containing heterocyclic ring) as claimed in claim 1.

13. An active material or electrode for a battery, which is made of the N-oxidated poly(nitrogen-containing heterocyclic ring) as claimed in claim 1.

14. A semiconductor which is made of the N-oxidated poly(nitrogen-containing heterocyclic ring) as claimed in claim 1.

15. An n-type semiconductor prepared by reducing the N-oxidated poly(nitrogen-containing heterocyclic ring) as claimed in claim 1 with a reducing agent or by electrochemical doping.

16. N-oxidated poly(nitrogen-containing condensed heterocyclic ring) containing a polymer chain represented by the formula (7)

(7)

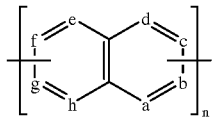

wherein any two of a, b, c, d, e, f, g and h represent carbon atoms that are involved in binding between repeating units, at least one of them represents an N→O group, the remainings independently represent a CH group or a nitrogen atom, the maximum total number of the N→O groups represented by a, b, c, and d is 2, the maximum total number of the nitrogen atoms is 3, the N→O groups represented by e, f, g, and h is 2, the maximum total number of the nitrogen atoms is 3, and the degree of polymerization n is at least 5.

17. N-oxidated poly(nitrogen-containing condensed heterocyclic ring) containing a polymer chain represented by the formula (8)

(8)

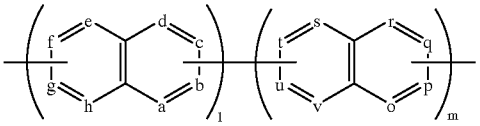

wherein any two of a, b, c, d, e, f, g, and h represent carbon atoms that are involved in binding between repeating units, at least one of them represents an N→O group, the remainings independently represent a CH group or a nitrogen atom, the maximum total number of the N→O groups represented by a, b, c, and d is 2, the maximum total number of the nitrogen atoms is 3, the maximum total number of the N→O groups represented by e, f, g, and h is 2, the maximum total number of the nitrogen atoms is 3, any two of o, p, q, r, s, t, u, and v represent carbon atoms that are involved in binding between repeating units, the remainings independently represent a CH group or a nitrogen atom, the maximum total number of the nitrogen atoms represented by o, p, q, and r is 3, the maximum total number of the nitrogen atoms contained in s, t, u, and v is 3, and the degree of polymerization 1+m is at least 5.

18. The N-oxidated poly(nitrogen-containing condensed heterocyclic ring) as claimed in claim 16, wherein said formula (7) is the formula (7a), (7b-1), (7b-2), (7c-1), or (7c-2):

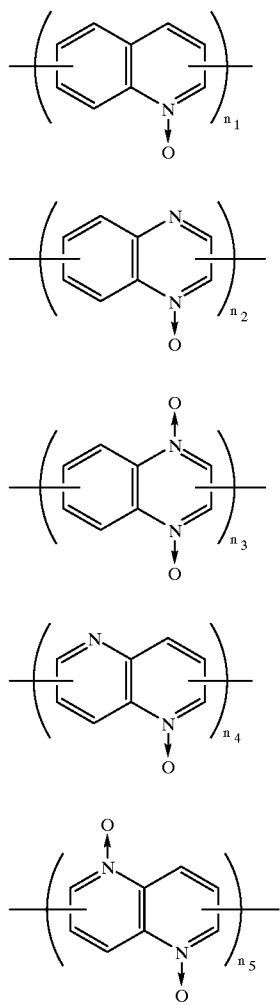

wherein the degree of polymerization $n_1$, $n_2$, $n_3$, $n_4$, and $n_5$ represent at least 5.

19. The N-oxidated poly(nitrogen-containing condensed heterocyclic ring) as claimed in claim 17, wherein said formula (8) is the formula (8a), (8b-1), (8b-2), (8c-1), or (8c-2):

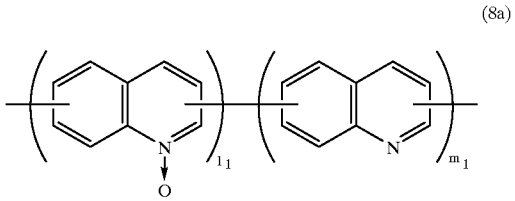

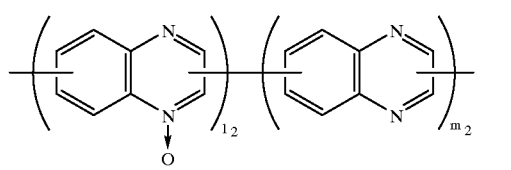

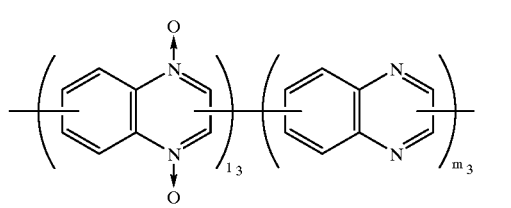

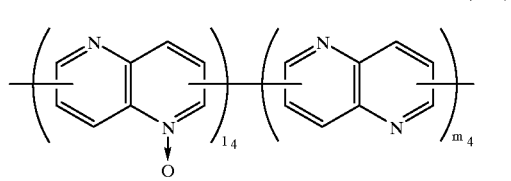

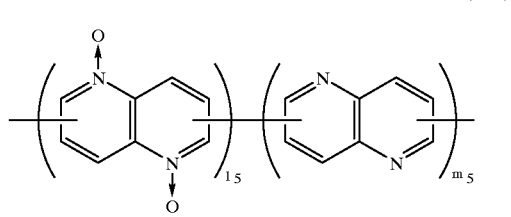

wherein the degree of polymerization $1_1+m_1$, $1_2+m_2$, $1_3+m_3$, $1_4+m_4$, and $1_5+m_5$ represent at least 5.

20. A method of producing the N-oxidated poly(nitrogen-containing condensed heterocyclic ring) as claimed in claim 16, which comprises reacting the poly(nitrogen-containing condensed heterocyclic ring) containing a polymer chain represented by the formula (9):

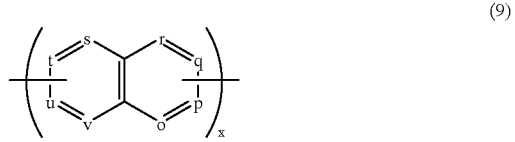

wherein o, p, q, r, s, t, u, and v have the same meaning as described above and the degree of polymerization x represents at least 5, with peroxide to N-oxidate the nitrogen atom in the ring.

21. A method of producing the N-oxidated poly(nitrogen-containing condensed heterocyclic ring) as claimed claim 16, which comprises reacting a dihalide derivative represented by the formula (10):

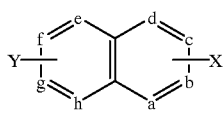

(10)

wherein X and Y each represents a halogen atom, any two of a, b, c, d, e, f, g, and h represent carbon atoms that bind to said halogen atoms, at least one of them represents an N→O group, the remainings independently represent a CH group or a nitrogen atom, the maximum total number of the N→O groups represented by a, b, c, and d is 2, the maximum total number of the nitrogen atoms is 3, the maximum total number of the N→O groups represented by e, f, g, and h is 2, and the maximum total number of the nitrogen atoms is 3, with a zerovalent nickel compound.

22. A method of producing the N-oxidated poly(nitrogen-containing condensed heterocyclic ring) as claimed in any of claims 16 to 19, which comprises subjecting a dihalide derivative represented by the formula (10):

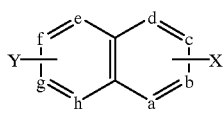

(10)

wherein X and Y each represents a halogen atom, any two of a, b, c, d, e, f, g, and h represent carbon atoms that bind to said halogen atoms, at least one of them represents an N→O group, the remainings independently represent a CH group or a nitrogen atom, the maximum total number of the N→O groups represented by a, b, c, and d is 2, and the maximum total number of the nitrogen atoms is 3, the maximum total number of the N→O groups represented by e, f, g, and h is 2, and the maximum total number of the nitrogen atoms is 3, to electrolytic reduction in the presence of a nickel compound.

23. The method of producing the N-oxidated poly (nitrogen-containing condensed heterocyclic ring) as claimed in claim 20, wherein said formula (9) is the formula (9a), (9b), or (9c):

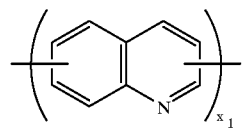

(9a)

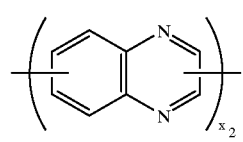

(9b)

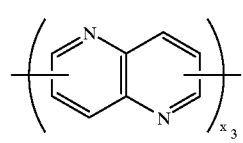

(9c)

wherein the degree of polymerization $x_1$, $x_2$, and $x_3$ represent atleast 5.

24. The method of producing the N-oxidated poly (nitrogen-containing condensed heterocyclic ring) as claimed in claim 21, wherein said formula (10) is the formula (10a), (10b-1), (10b-2), (10c-1), or (10c-2):

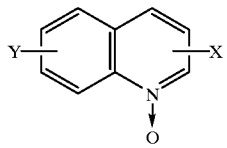

(10a)

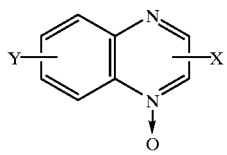

(10b-1)

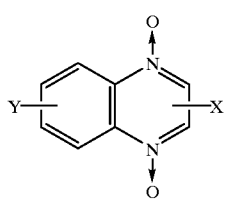

(10b-2)

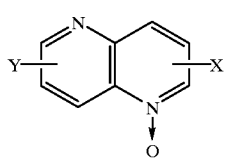

(10c-1)

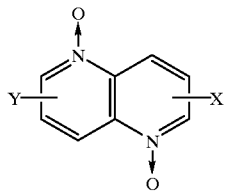

(10c-2)

wherein X and Y each represents a halogen atom.

25. The method of producing the N-oxidated poly (nitrogen-containing condensed heterocyclic ring) as claimed in claim 22, wherein said formula (10) is the formula (10a), (10b-1), (10b-2), (10c-1), or (10c-2):

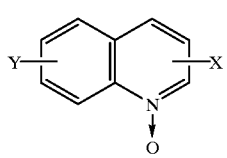

(10a)

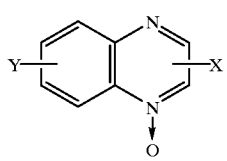

(10b-1)

(10b-2)

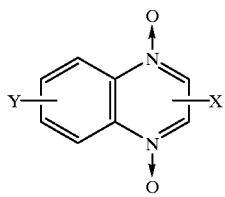

(10c-1)

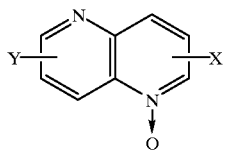

(10c-2)

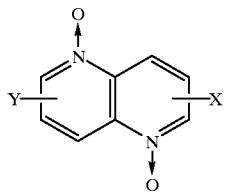

wherein X and Y each represents a halogen atom.

26. A fiber or film which is made of the N-oxidated poly(nitrogen-containing condensed heterocyclic ring) as claimed in claim 16.

27. An electrochromic device which is made of the N-oxidated poly(nitrogen-containing condensed heterocyclic ring) as claimed in claim 16.

28. An active material or electrode for a battery, which is made of the N-oxidated poly(nitrogen-containing condensed heterocyclic ring) as claimed in claim 16.

29. A semiconductor which is made of the N-oxidated poly(nitrogen-containing condensed heterocyclic ring) as claimed in claim 16.

30. An n-type semiconductor prepared by reducing the N-oxidated poly(nitrogen-containing condensed heterocyclic ring) as claimed in claim 16 with a reducing agent or by electrochemical doping.

* * * * *